US012757615B2

(12) United States Patent
Lim et al.

(10) Patent No.: US 12,757,615 B2
(45) Date of Patent: Oct. 6, 2026

(54) DISPLAY APPARATUS

(71) Applicant: Samsung Display Co., LTD., Yongin-si (KR)

(72) Inventors: Hyungchul Lim, Yongin-si (KR); Hyejin Kim, Yongin-si (KR); Daehyun Noh, Yongin-si (KR); Donghyun Lee, Yongin-si (KR); Wanheui Lee, Yongin-si (KR); Taekyung Yim, Yongin-si (KR); Deukjong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 395 days.

(21) Appl. No.: 18/584,141

(22) Filed: Feb. 22, 2024

(65) Prior Publication Data

US 2024/0324408 A1 Sep. 26, 2024

(30) Foreign Application Priority Data

Mar. 24, 2023 (KR) ........................ 10-2023-0039127
Jun. 20, 2023 (KR) ........................ 10-2023-0078851

(51) Int. Cl.
*H10K 59/80* (2023.01)
*H10K 59/122* (2023.01)
(Continued)

(52) U.S. Cl.
CPC ......... *H10K 59/873* (2023.02); *H10K 59/122* (2023.02); *H10K 59/40* (2023.02); *H10K 59/8792* (2023.02); *H10K 2102/311* (2023.02)

(58) Field of Classification Search
CPC .... H10K 59/873; H10K 59/122; H10K 59/40; H10K 59/8792; H10K 2102/311;
(Continued)

(56) References Cited

U.S. PATENT DOCUMENTS 10,873,043 B2 12/2020 Jin
10,910,589 B2 2/2021 Jeong et al.
(Continued)

FOREIGN PATENT DOCUMENTS

EP 3876299 A1 9/2021
JP 2022511198 A 1/2022
(Continued)

*Primary Examiner* — J.E. Schoenholtz
(74) *Attorney, Agent, or Firm* — CANTOR COLBURN LLP

(57) ABSTRACT

A display apparatus includes: a substrate including a display area, a bending area, and a peripheral area between the display area and the bending area; a display element layer provided on the display area of the substrate; a thin-film encapsulation layer on the display element layer; a first insulating layer on the thin-film encapsulation layer; an anti-reflection layer on the first optical layer; and an organic layer provided on the peripheral area and the bending area of the substrate and apart from the display area of the substrate in a plan view in an unfolded state of the bending area, where the first insulating layer includes a valley structure provided on the peripheral area, the valley structure having a valley hole, and in the plan view in the unfolded state, the anti-reflection layer is apart from at least one of the organic layer and the valley structure.

20 Claims, 18 Drawing Sheets

(51) Int. Cl.
*H10K 59/40* (2023.01)
*H10K 102/00* (2023.01)

(58) Field of Classification Search
CPC ............. H10K 59/124; H10K 59/8791; H10K 77/111; Y02E 10/549
See application file for complete search history.

(56) References Cited

U.S. PATENT DOCUMENTS

| | | | | |
|---|---|---|---|---|
| 11,342,532 | B2 | 5/2022 | Liu et al. | |
| 2016/0172428 | A1 | 6/2016 | Song et al. | |
| 2021/0091343 | A1* | 3/2021 | Lee | H10K 59/87 |
| 2022/0013607 | A1* | 1/2022 | Lee | H10K 59/124 |
| 2022/0029129 | A1* | 1/2022 | Lee | H10K 77/111 |
| 2022/0302405 | A1* | 9/2022 | Choi | B23K 26/364 |
| 2023/0023671 | A1* | 1/2023 | Shim | H10K 59/12 |
| 2023/0092412 | A1 | 3/2023 | Lee et al. | |
| 2024/0029633 | A1* | 1/2024 | Won | G09G 3/32 |
| 2024/0155920 | A1* | 5/2024 | Bok | H10K 59/131 |

FOREIGN PATENT DOCUMENTS

| | | | |
|---|---|---|---|
| KR | 101011718 | B1 | 1/2011 |
| KR | 1020170094266 | A | 8/2017 |
| KR | 1020200049389 | A | 5/2020 |
| KR | 1020200069527 | A | 6/2020 |

* cited by examiner

DISPLAY APPARATUS

This application claims priority to Korean Patent Application Nos. 10-2023-0039127, filed on Mar. 24, 2022, and 10-2023-0078851, filed on Jun. 20, 2023, and all the benefits accruing therefrom under 35 U.S.C. § 119, the contents of which in their entirety are herein incorporated by reference.

BACKGROUND

1. Field

One or more embodiments relate to a display apparatus and a method of manufacturing the display apparatus.

2. Description of the Related Art

A display apparatus has been used for various purposes. In addition, as the display apparatus has become thinner and more lightweight, the range of use of the display apparatus has been widening. For example, the display apparatus may be used in small products such as a mobile phone, and may be used in a large product such as a television. As the display apparatus has been used in various fields, there have been increasing demands for the display apparatus for providing high-quality images.

SUMMARY

One or more embodiments include a display apparatus having improved durability and improved image characteristics. However, this is only an example, and the scope of the disclosure is not limited thereto.

Additional aspects will be set forth in part in the description that follows and, in part, will be apparent from the description, or may be learned by practice of the embodiments of the disclosure.

According to one or more embodiments, a display apparatus includes: a substrate including a display area, a bending area, and a peripheral area between the display area and the bending area; a display element layer provided on the display area of the substrate; a thin-film encapsulation layer on the display element layer; a first insulating layer on the thin-film encapsulation layer; an anti-reflection layer on the first insulating layer; and an organic layer provided on the peripheral area and the bending area of the substrate and apart from the display area of the substrate in a plan view in an unfolded state of the bending area, where the first insulating layer includes a valley structure provided on the peripheral area, the valley structure has a valley hole, and in the plan view in the unfolded state, the anti-reflection layer is apart from at least one of the organic layer and the valley structure.

In the plan view in the unfolded state, the anti-reflection layer may be apart from the organic layer.

In the plan view in the unfolded state, the anti-reflection layer may be apart from the organic layer and the valley structure.

In the plan view in the unfolded state, the anti-reflection layer may be apart from the valley structure.

The first insulating layer may extend onto the organic layer, the organic layer may extend onto the bending area of the substrate, and the valley hole may pass through an upper surface of the first insulating layer.

The display apparatus may further include a circuit layer on the display area of the substrate, and a planarization layer between the circuit layer and the display element layer, wherein the organic layer includes a first organic layer including the same material as the planarization layer, and apart from the planarization layer.

The display apparatus may further include a pixel-defining layer on the planarization layer, wherein the organic layer further includes a second organic layer including the same material as the pixel-defining layer, and apart from the pixel-defining layer.

The display apparatus may further include a buffer layer provided on the display area of the substrate, a thin-film transistor disposed on the buffer layer, and an interlayer-insulating film on the thin-film transistor, wherein the buffer layer and the interlayer-insulating film extend onto the bending area of the substrate, and the organic layer is disposed on the interlayer-insulating film.

The display apparatus may further include an input sensing layer between the display element layer and the first insulating layer, where the input sensing layer may include a first inorganic insulating layer, a second inorganic insulating layer on the first inorganic insulating layer, and a conductive layer between the first inorganic insulating layer and the second inorganic insulating layer, and the first inorganic insulating layer and the second inorganic insulating layer may extend between the organic layer and the first insulating layer.

The valley structure may include: a first valley structure arranged adjacent to the display area of the substrate, and a second valley structure arranged between the first valley structure and the bending area of the substrate, the first valley structure may have a first valley hole passing through the first insulating layer, the second valley structure may have a second valley hole passing through the first insulating layer, and the valley hole may include the first valley hole and the second valley hole.

The valley structure may further include a third valley structure between the first valley structure and the second valley structure, and the third valley structure may have a third valley hole passing through the first insulating layer.

The first insulating layer may have a bending groove provided on the bending area of the substrate, and the bending groove may expose an upper surface of the organic layer.

The thin-film encapsulation layer may include a first inorganic encapsulation layer, an organic encapsulation layer, and a second inorganic encapsulation layer, which are stacked, and the first inorganic encapsulation layer and the second inorganic encapsulation layer may be apart from the bending area of the substrate.

According to one or more embodiments, a display apparatus includes: a substrate including a display area and a peripheral area surrounding the display area; a display layer provided on the display area of the substrate, where the display layer includes a circuit layer, a planarization layer, a pixel-defining layer, and a display element layer; a first insulating layer on the display layer; an anti-reflection layer on the first insulating layer; and an organic layer on the peripheral area, where the organic layer includes: a first organic layer including the same material as the planarization layer, and apart from the planarization layer, and a second organic layer including the same material as the pixel-defining layer, and apart from the pixel-defining layer, the first insulating layer includes a valley structure provided on the peripheral area of the substrate, the valley structure has a valley hole passing through an upper surface of the first insulating layer, and in a plan view in an unfolded state of the bending area, the anti-reflection layer is apart from at least one of the organic layer and the valley structure.

The anti-reflection layer may not overlap the organic layer and the valley structure in the plan view in the unfolded state.

A thickness of the organic layer may be greater than a thickness of the first insulating layer.

The display apparatus may further include a lower adhesive layer between the anti-reflection layer and the first insulating layer, where in the plan view in the unfolded state, the lower adhesive layer is apart from at least one of the organic layer and the valley structure.

The planarization layer may include a first planarization layer and a second planarization layer on the first planarization layer, and the first organic layer may include a first lower organic layer including the same material as the first planarization layer, and apart from the first planarization layer, and a first upper organic layer including the same material as the second planarization layer, and apart from the second planarization layer.

An end of the organic layer may be provided between the anti-reflection layer and the substrate.

The display apparatus may further include a second insulating layer on the first insulating layer, the second insulating layer may have a refractive index different from a refractive index of the first insulating layer, and the second insulating layer may extend between the organic layer and the anti-reflection layer and overlap the end of the organic layer in the plan view.

These and/or other aspects will become apparent and more readily appreciated from the following description of the embodiments, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
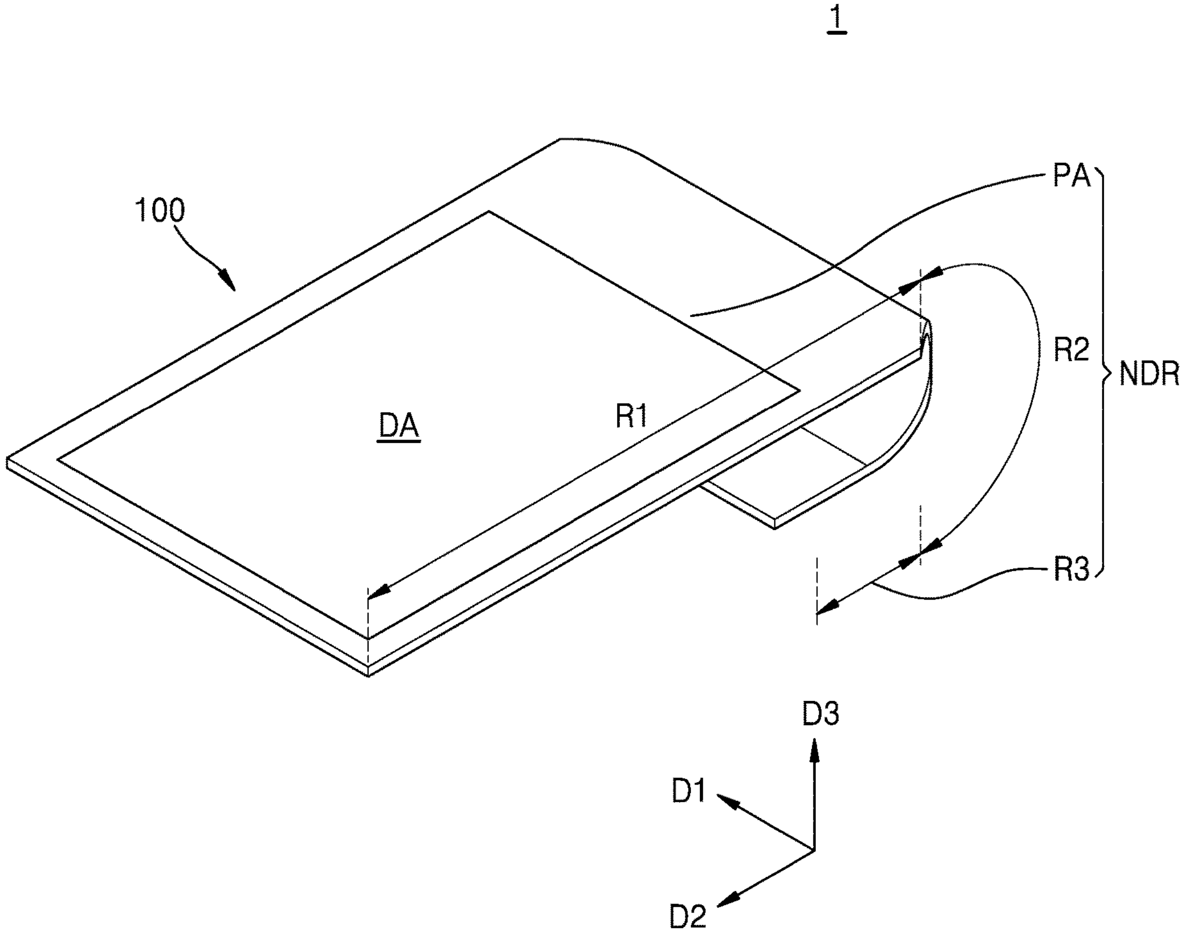
FIG. 1A is a perspective view schematically illustrating a portion of a substrate of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, certain embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

Hereinafter, embodiments will be described with reference to the accompanying drawings, wherein like reference numerals refer to like elements throughout and a repeated description thereof is omitted.

In an embodiment below, terms, such as "first" and "second," are used herein merely to describe a variety of elements, but the elements are not limited by the terms. Such terms are used only for the purpose of distinguishing one element from another element.

In an embodiment below, an expression used in the singular encompasses the expression of the plural, unless it has a clearly different meaning in the context.

In an embodiment below, terms, such as "include" or "comprise," may be construed to denote a certain characteristic or element, or a combination thereof, but may not be construed to exclude the existence of or a possibility of addition of one or more other characteristics, elements, or combinations thereof.

It will be understood that when a layer, region, or component is referred to as being "on" another layer, region, or component, it can be directly or indirectly on the other layer, region, or component. That is, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component therebetween.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. In the present specification, "A and/or B" means A or B, or A and B. In the present specification, "at least one of A and B" means A or B, or A and B.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

Sizes of elements in the drawings may be exaggerated or reduced for convenience of explanation. For example, since sizes and thicknesses of elements in the drawings are arbitrarily illustrated for convenience of explanation, the disclosure is not limited thereto.

Hereinafter, a display apparatus according to embodiments is described.

FIG. 1A is a perspective view schematically illustrating a portion of a substrate 100 of a display apparatus 1 according to an embodiment.

Referring to FIG. 1A, the display apparatus 1 may include the substrate 100. The substrate 100 may be bendable.

The substrate 100 may have a first area R1, a second area R2, and a third area R3. The first area R1 of the substrate 100 may have a flat surface parallel to a first direction D1. The first area R1 of the substrate 100 may include a display area DA and a peripheral area PA. A display element may be provided on the display area DA of the substrate 100. In a plan view, the peripheral area PA of the substrate 100 may surround the display area DA. As used herein, the "plan view" is a view in a third direction D3. A display element may not be disposed on the peripheral area PA of the substrate 100. The peripheral area PA of the substrate 100 may correspond to a portion of a non-display area NDA. The non-display area NDA of the substrate 100 may further include the second area R2 and the third area R3 in addition to the peripheral area PA.

Each of the second area R2 and the third area R3 of the substrate 100 may include a protrusion area protruding in an opposite direction of a second direction D2 from the first area R1, and may be bent in the protrusion area. A portion of the non-display area NDA is bent, and thus, a bezel width of the display apparatus 1 may be reduced.

The second area R2 of the substrate 100 may be provided at one side of the peripheral area PA. The second area R2 of the substrate 100 may be a "bending area", which may be bendable. The second area R2 of the substrate 100 may be bent with respect to a bending axis from the first area R1, and the bending axis may extend in a first direction D1. The second area R2 of the substrate 100 may protrude in the opposite direction of the second direction D2 from the first area R1. The second area R2 of the substrate 100 may be bent in the protrusion area. The second direction D2 may be different from the first direction D1. The third direction D3 may cross the first direction D1 and the second direction D2. For example, the first direction D1 may be an x-axis direction, the second direction D2 may be a y-axis direction, and the third direction D3 may be a z-axis direction. However, one or more embodiments are not limited thereto.

In FIG. 1A, the substrate 100 is bent with the same curvature radius with respect to the bending axis. However, one or more embodiments are not limited thereto. The substrate 100 may be bent with a non-uniform curvature radius with respect to the bending axis in another embodiment.

The third area R3 of the substrate 100 may be apart from the first area R1 of the substrate 100 in the third direction D3 or the opposite direction of the third direction D3. One surface of the third area R3 of the substrate 100 and one surface of the first area R1 may face each other. One surface of the third area R3 of the substrate 100 may be connected to one surface of the first area R1 through one surface of the second area R2. The second area R2 may be provided between the first area R1 and the third area R3, and may connect the first area R1 to the third area R3. The first area R1, the second area R2, and the third area R3 of the substrate 100 may be integrally provided as a single body, but are not limited thereto.

The substrate 100 may include various materials having flexible, rollable, or bendable properties. In an embodiment, for example, the substrate 100 may include polymer resin, such as polyethersulfone ("PES"), polyacrylate ("PAR"), polyetherimide ("PEI"), polyethylene naphthalate ("PEN"), polyphenylene sulfide ("PPS"), polyarylate, polyimide ("PI"), or cellulose acetate propionate ("CAP"). The substrate 100 may have a single-layered or multi-layered structure of the materials, and when the substrate 100 has a multi-layered structure, the substrate 100 may further include an inorganic layer.

Figure 1B:
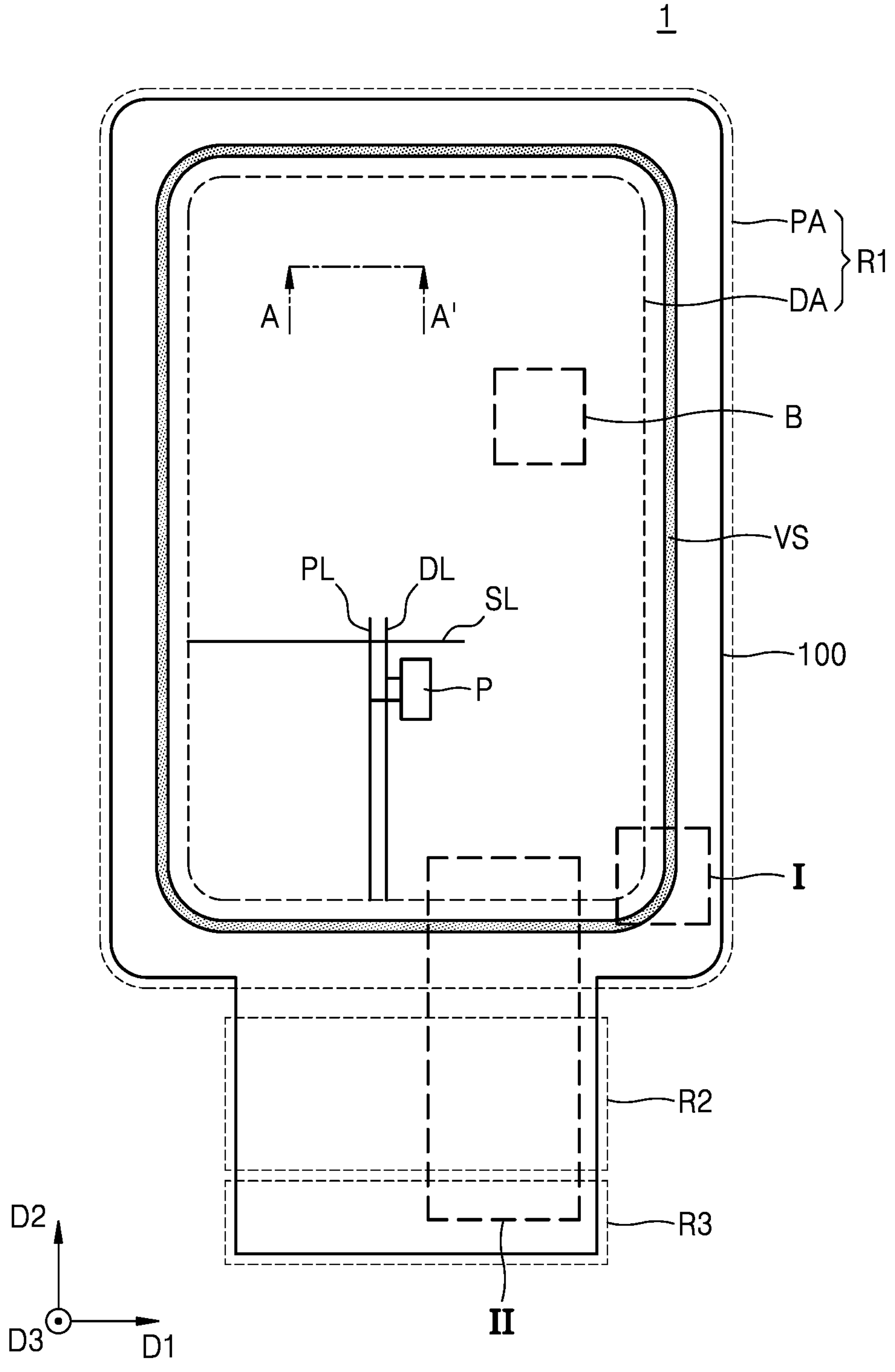
FIG. 1B is a plan view schematically illustrating a portion of a display apparatus in an unfolded state according to an embodiment.

FIG. 1B is a plan view schematically illustrating a portion of the display apparatus 1 in an unfolded state according to an embodiment. That is, FIG. 1B is a plan view illustrating a portion of the display apparatus 1 in a state that the second area R2 is not bent.

Referring to FIG. 1B, the first area R1 of the substrate 100 of the display apparatus 1 may include the display area DA and the peripheral area PA around the display area DA. A plurality of pixels P may be provided on the display area DA of the substrate 100. The display apparatus 1 may provide an image by using light emitted from the pixels P. Each of the pixels P may include a display element. The display element may include an organic light-emitting diode or an inorganic light-emitting diode. The pixels P may emit red, green, blue, or white light. Each of the pixels P may be connected to a pixel circuit including a thin-film transistor, a storage capacitor, and the like. The pixel circuit may be connected to a scan line SL, a data line DL, and a driving voltage line PL, the data line DL and the driving voltage line PL crossing the scan line SL. Each of the pixels P may emit light according to driving of the pixel circuit. Through the light emitted from the pixels P, an image may be provided on the display area DA. The pixel P according to the disclosure may be defined as an emission area for emitting one of red, green, blue, and white light. The pixel circuit is described in greater detail with reference to FIG. 1C.

The display area DA of the substrate 100 has a quadrangular shape as a whole, in a plan view, and may have a round corner portion in which each of edges are curved. In this case, the first area R1 of the substrate 100 may have curved edges and may have a planar shape similar to that of the display area DA. Unlike the above, the display area DA of the substrate 100 may have various shapes, such as a polygon, a circle, or an ellipse.

The peripheral area PA of the substrate 100 is an area in which the pixels P are not arranged, and may not provide an image. Elements for driving the pixels P may be disposed on the peripheral area PA, and the elements may include a terminal portion, to which a printed circuit board or a driver integrated circuit ("IC") is connected. The printed circuit board may include a built-in driving circuit unit, a driving voltage supply line, a common voltage supply line, and a driving circuit unit, or the built-in driving circuit unit, the driving voltage supply line, the common voltage supply line, and the driving circuit unit may be provided on the printed circuit board. The driving voltage supply line may provide a driving voltage to the pixels P, and the common voltage supply line may supply a common voltage to an opposite electrode of an organic light-emitting diode included in the pixels P.

In FIG. 1B, the display apparatus 1 having a flat display surface is shown. However, one or more embodiments are not limited thereto. In another embodiment, the display apparatus 1 may include a three-dimensional display surface or a curved display surface.

When the display apparatus 1 includes a three-dimensional display surface, the display apparatus 1 may include a plurality of display areas indicating different directions from each other, and may include, for example, a polygonal columnar display surface. In another embodiment, when the display apparatus 1 includes a curved display surface, the display apparatus 1 may be implemented in various shapes, such as a flexible, foldable, or rollable display apparatus.

In addition, in an embodiment, in FIG. 1B, the display apparatus 1 that may be applicable to a mobile phone terminal is shown. Although not shown, electronic modules mounted on a main board, a camera module, a power module, etc. may be arranged together with the display apparatus 1 in a bracket/case, thereby configuring mobile phone terminal. The display apparatus 1 according to one or more embodiments may be applied to small to medium-sized electronic devices, such as tablets, car navigation systems, game consoles, and smart watches, as well as large-sized electronic devices, such as televisions and monitors.

Hereinafter, an organic light-emitting display apparatus is described as an example of the display apparatus 1 according to an embodiment. However, the display apparatus of one or more embodiments is not limited thereto. In another embodiment, the display apparatus 1 of one or more embodiments may be an inorganic light-emitting display apparatus (inorganic light-emitting display or inorganic electroluminescent ("EL") display apparatus), or may be a display apparatus, such as a quantum dot light-emitting display. For example, an emission layer of a display element provided in the display apparatus 1 may include an organic material, an inorganic material, quantum dots, an organic material and quantum dots, or an inorganic material and quantum dots.

A valley structure VS may be provided on the peripheral area PA of the substrate 100. The valley structure VS may be provided outside the display area DA, on the peripheral area PA of the substrate 100, and may be apart from the display area DA. In a plan view, the valley structure VS may have a closed-loop shape surrounding the display area DA. The valley structure VS may include a first valley structure VS1 and a second valley structure VS2, which are described below with reference to FIGS. 7A to 10C. The valley structure VS is described in greater detail with reference to FIGS. 7A to 10C.

Figure 1C:
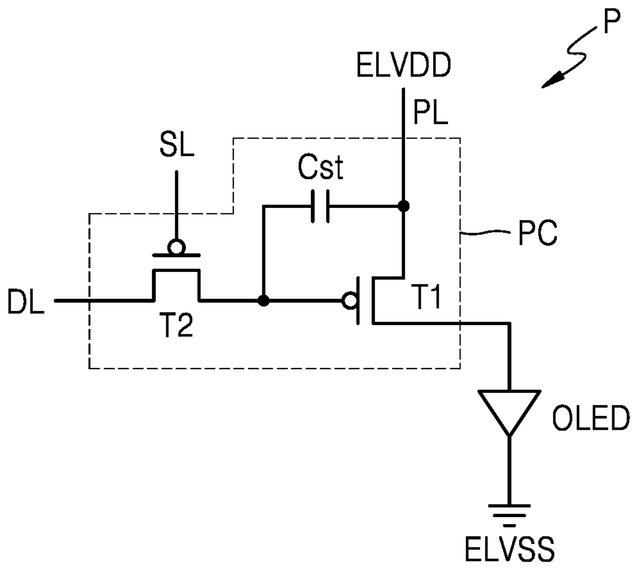
FIG. 1C illustrates a display element provided in any one of a display apparatus and a pixel circuit connected thereto.

FIG. 1C illustrates a display element provided in one pixel P of a display apparatus, and a pixel circuit PC connected thereto. To describe FIG. 1C, reference is made to FIG. 1B.

Referring to FIG. 1C, an organic light-emitting diode OLED, which is a display element, may be connected to the pixel circuit PC. The pixel circuit PC may include a first thin-film transistor T1, a second thin-film transistor T2, and a storage capacitor Cst. In an embodiment, for example, the organic light-emitting diode OLED may emit one of red, green, and blue light, or one of red, green, blue, and white light.

The second thin-film transistor T2, which is a switching thin-film transistor, may be connected to a scan line SL and a data line DL. The second thin-film transistor T2 may transfer a data voltage received via the data line DL to the first thin-film transistor T1 according to a switching voltage received via the scan line SL.

The storage capacitor Cst may be connected to the second thin-film transistor T2 and a driving voltage line PL and may store a voltage corresponding to a voltage difference between a voltage received from the second thin-film transistor T2 and a first power voltage ELVDD supplied to the driving voltage line PL.

The first thin-film transistor T1 is a driving thin-film transistor and may be connected to the driving voltage line PL and the storage capacitor Cst. The first thin-film transistor T1 may control a driving current flowing from the driving voltage line PL to the organic light-emitting diode OLED in response to a voltage value stored in the storage capacitor Cst. The organic light-emitting diode OLED may emit light having a luminance according to the driving current. An opposite electrode (e.g., a cathode) of the organic light-emitting diode OLED may receive a second power voltage ELVSS.

In FIG. 1C, the pixel circuit PC includes two thin-film transistors T1 and T2 and one storage capacitor Cst. However, the number of each of the thin-film transistors T1 and T2 or the number of storage capacitors Cst may be variously changed depending on the design of the pixel circuit PC.

Figure 2:
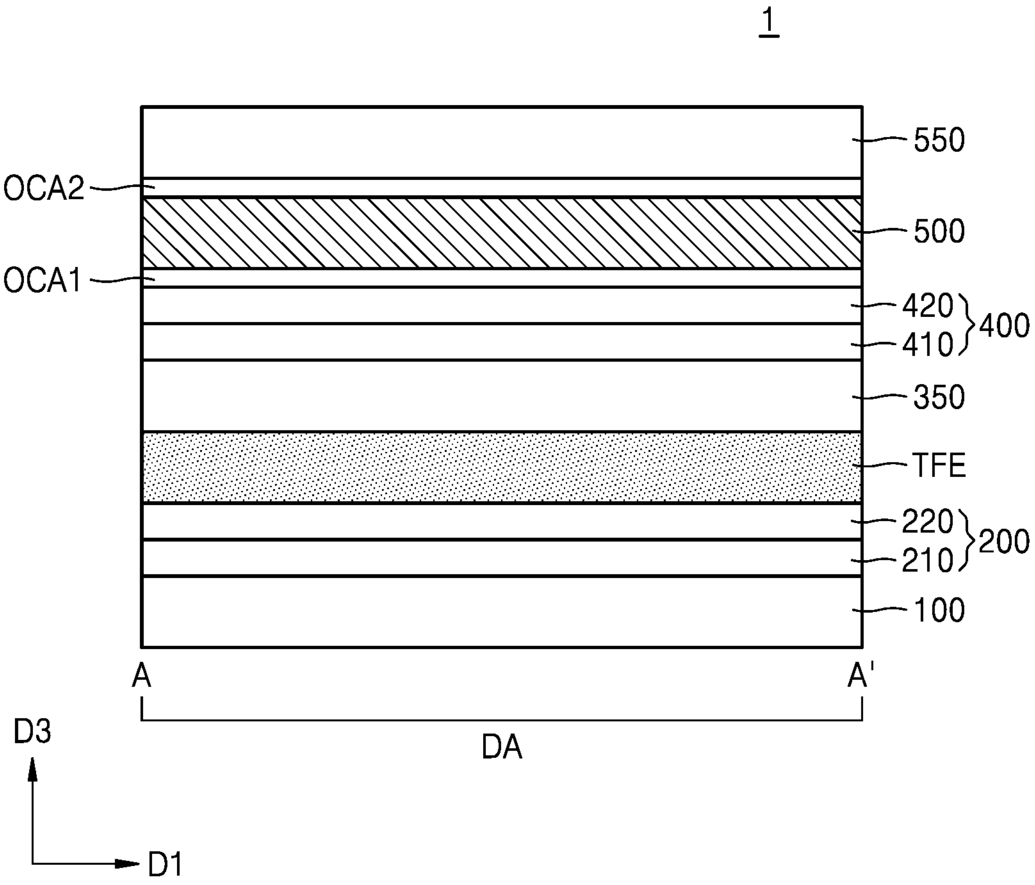
FIG. 2 is a diagram for describing elements of a display apparatus in a display region of a substrate, taken along line A-A' in FIG. 1B.

FIG. 2 is a diagram for describing elements of a display apparatus 1 in a display area DA of a substrate 100, and is a cross-sectional view taken along line A-A' in FIG. 1B.

Referring to FIG. 2, the display apparatus 1 according to an embodiment may include the substrate 100, a display layer 200, a thin-film encapsulation layer TFE, an input sensing layer 350, an insulating layer 400, an anti-reflection layer 500, and a window layer 550.

The display layer 200 may be disposed on the display area DA of the substrate 100. The display layer 200 may include a circuit layer 210 and a display element layer 220. The display layer 200 may further include a planarization layer 110 and a pixel-defining layer 115, which are described below with reference to FIG. 5A. The display element layer 220 may include a plurality of display elements (e.g., organic light-emitting diodes), and each of the display elements may define a pixel (P in FIGS. 1B and 1C). The circuit layer 210 may include the first and second transistors T1 and T2 and the storage capacitor Cst as described with reference to FIG. 1C. The display layer 200 may generate an image.

The thin-film encapsulation layer TFE may be disposed on the display element layer 220 and may protect the display element layer 220. For example, the thin-film encapsulation layer 300 may prevent elements (e.g., display elements) of the display element layer 220 from being damaged by external foreign substances, such as moisture. The thin-film encapsulation layer TFE may include at least one inorganic encapsulation layer and at least one organic encapsulation layer.

The input sensing layer 350 may be disposed on the thin-film encapsulation layer TFE. In an embodiment, for example, the input sensing layer 350 may be disposed directly on the display layer 200. The thin-film encapsulation layer TFE includes at least one organic encapsulation layer (320 in FIG. 7A), as described below with reference to FIG. 7A, and may thus provide a flat base surface. Accordingly, even when elements of the input sensing layer 350 are formed by a continuous process, a defect rate may be reduced.

The input sensing layer 350 may have a multi-layered structure. The input sensing layer 350 may include a sensing electrode, a trace line, and at least one insulating layer. The trace line may be connected to the sensing electrode. The input sensing layer 350 may sense an external input, such as a touch input of a user. For example, the input sensing layer 350 may detect an external input by using a capacitive method. Unlike this, the input sensing layer 350 may detect an external input by using an electromagnetic induction method or a pressure sensing method.

The insulating layer 400 may be disposed on the input sensing layer 350. In an embodiment, for example, the insulating layer 400 may be disposed directly on the input sensing layer 350. The insulating layer 400 may include a first insulating layer 410 and a second insulating layer 420 disposed on the first insulating layer 410. The first insulating layer 410 may include an organic insulating material. The second insulating layer 420 may include an organic insulating material, and may include a material different from a material of the first insulating layer 410. The second insulating layer 420 may have a refractive index different from a refractive index of the first insulating layer 410. In an embodiment, for example, the refractive index of the second insulating layer 420 may be greater than the refractive index of the first insulating layer 410. By the difference in refractive index between the first insulating layer 410 and the second insulating layer 420, the insulating layer 400 may improve light emission efficiency of light emitted from display elements of the display element layer 220. The insulating layer 400 may improve front light efficiency and/or side visibility of light emitted from the organic light-emitting diode (OLED in FIG. 1C).

Referring to FIG. 2 together with FIG. 1B, the first insulating layer 410 may further extend to the peripheral area PA of the substrate 100 compared to the second insulating layer 420, and in a plan view, may be arranged to be further adjacent to a side surface of the substrate 100. For example, in a plan view, a distance between the first insulating layer 410 and the side surface of the substrate 100 may be less than a distance between the second insulating layer 420 and the side surface of the substrate 100.

Referring to FIG. 2 again, the anti-reflection layer 500 may be disposed on the insulating layer 400. The anti-reflection layer 500 may reduce reflectivity of light (external light) incident toward the display apparatus 1 from the outside. The anti-reflection layer 500 may include a retarder and a polarizer. The retarder may be of a film type or a liquid crystal coating type, and may include a N/2 retarder and/or a N4 retarder. The polarizer may be of a film type or a liquid crystal coating type. The film-type retarder/polarizer may include a stretchable synthetic resin film, and the liquid crystal coating-type retarder/polarizer may include liquid crystals arranged in a certain array. The anti-reflection layer 500 may further include a protective film.

A lower adhesive layer OCA1 may be provided between the anti-reflection layer 500 and the insulating layer 400. The anti-reflection layer 500 may be attached to the insulating layer 400 through the lower adhesive layer OCA1. The lower adhesive layer OCA1 may be an optical clear adhesive member, but is not limited thereto.

The window layer 550 may be provided on the anti-reflection layer 500. An upper adhesive layer OCA2 may be arranged between the anti-reflection layer 500 and the window layer 550. The window layer 550 may be attached to the anti-reflection layer 500 through the upper adhesive layer OCA2. The upper adhesive layer OCA2 may be an optical clear adhesive member, but is not limited thereto. Unlike shown, the window layer 550 may be substituted for another element or omitted.

Figure 3:
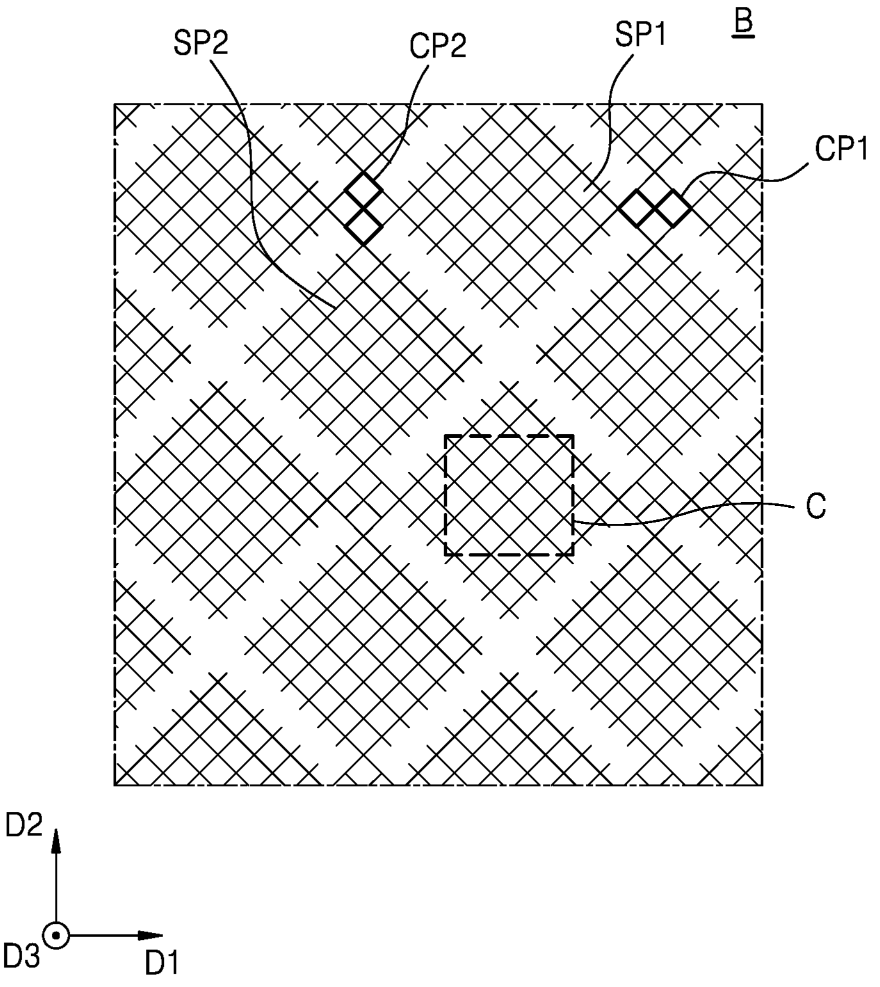
FIG. 3 is a plan view for describing an input sensing layer according to an embodiment, and is an enlarged view of region B in FIG. 1B.

FIG. 3 is a plan view for describing the input sensing layer 350 according to an embodiment, and is an enlarged view of region B in FIG. 1B.

Referring to FIG. 3, the input sensing layer 350 may include a plurality of first sensing electrodes SP1, a first connection electrode CP1, a plurality of second sensing electrodes SP2, and a second connection electrode CP2. The plurality of first sensing electrodes SP1 may be arranged in the first direction D1, and the plurality of second sensing electrodes SP2 may be arranged in the second direction D2. First sensing electrodes SP1 that are adjacent to each other may be electrically connected to each other through the first connection electrode CP1. Second sensing electrodes SP2 that are adjacent to each other may be electrically connected to each other through the second connection electrode CP2.

Each of the first sensing electrodes SP1 and the second sensing electrodes SP2 may include a conductive layer, and the conductive layer may include a metal layer or a transparent conductive layer. The metal layer may include molybdenum (Mo), silver (Ag), titanium (Ti), copper (Cu), aluminum (Al), and alloys thereof. The transparent conductive layer may include a transparent conductive oxide, such as indium tin oxide ("ITO"), indium zinc oxide ("IZO"), zinc oxide (ZnO), and/or indium tin zinc oxide ("ITZO"). Unlike this, the transparent conductive layer may include a conductive polymer, such as poly(3,4-ethylenedioxythiophene) ("PEDOT"), metal nanowires, carbon nanotubes, and/or graphene. Each of the first connection electrode CP1 and the second connection electrode CP2 may include a metal layer as described above, or a conductive layer, such as a transparent conductive layer.

Each of the first and second sensing electrodes SP1 and SP2 and the first and second connection electrodes CP1 and CP2 may have a mesh structure including a plurality of openings. A mesh structure of the first and sensing electrodes SP1 and SP2 is described below.

Figure 4:
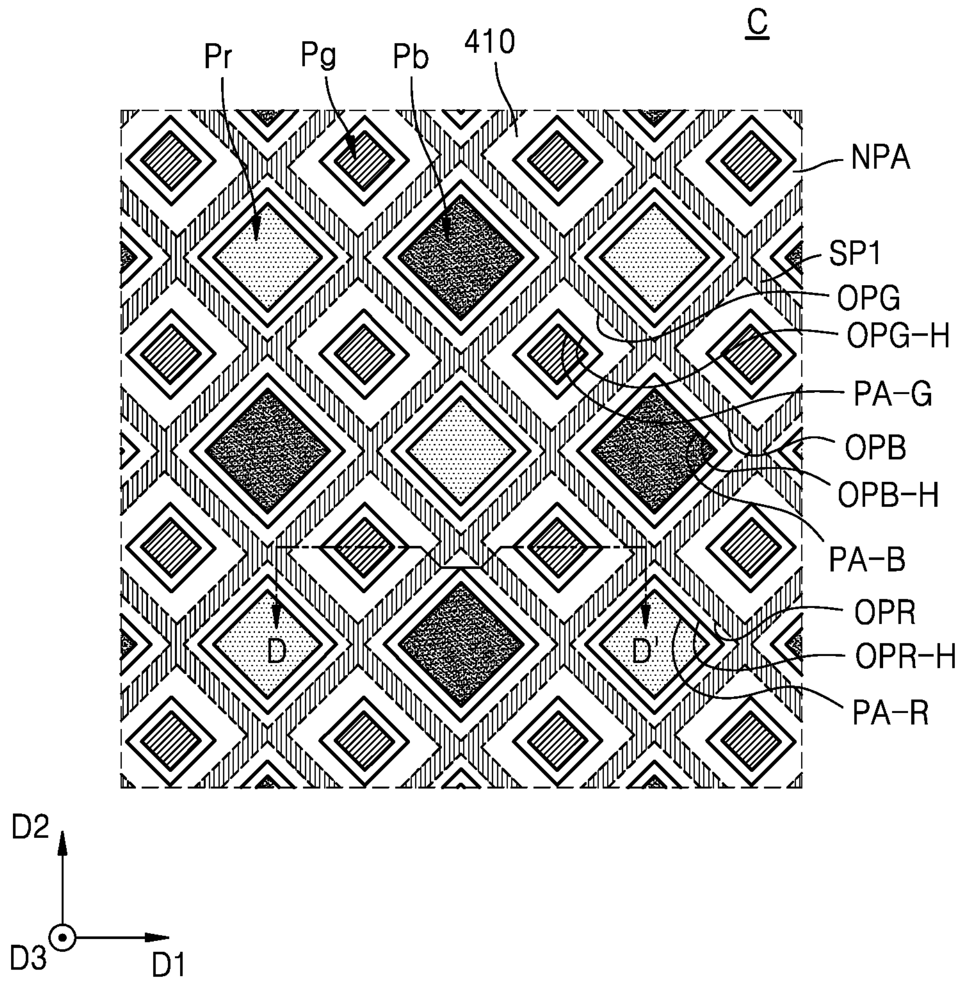
FIG. 4 is an enlarged view of one of first sensing electrodes, and is an enlarged view of region C in FIG. 3.

FIG. 4 is an enlarged view of one of the first sensing electrodes SP1, and corresponds to an enlarged view of region C in FIG. 3. Hereinafter, for convenience of description, a singular first sensing electrode is described.

Referring to FIG. 4, the pixels (P in FIG. 1B) may include a red pixel Pr for emitting red light, a green pixel Pg for emitting green light, and a blue pixel Pb for emitting blue light.

Each of emission areas PA-R, PA-G, and PA-B may be distinguished according to a color of light generated by an organic light-emitting diode (OLED in FIG. 1C), which, in a plan view, overlaps the emission areas PA-R, PA-G, and PA-B. In an embodiment, for example, the emission areas PA-R, PA-G, and PA-B may include a red light emission area PA-R, a green light emission area PA-G, and a blue light emission area PA-B. The red light emission area PA-R, the green light emission area PA-G, and the blue light emission area PA-B may be provided on the red pixel Pr, the green pixel Pg, and the blue pixel Pb, respectively. The emission areas PA-R, PA-G, and PA-B divided into three different areas according to a color of emitted light are described above. However, one or more embodiments are not limited thereto.

The first sensing electrode SP1 may not overlap the emission areas PA-R, PA-G, and PA-B, and may overlap a non-emission area NPA in a plan view.

The first sensing electrode SP1 may include mesh lines, and may have a plurality of mesh holes OPR, OPG, and OPB. The mesh lines of the first sensing lines SP1 may have a three-layer structure of Ti/Al/Ti. The mesh holes OPR, OPG, and OPB may be defined by the mesh lines of the first sensing electrodes SP1. The mesh holes OPR, OPG, and OPB may be defined in the emission areas PA-R, PA-G, and PA-B, respectively. For example, the mesh holes OPR, OPG, and OPB may correspond to the emission areas PA-R, PA-G, and PA-B in one-to-one manner.

The first insulating layer 410 may cover the first sensing electrode SP1 on the first sensing electrode SP1. Display elements of the pixels Pr, Pg, and Pb may be provided on the first insulating layer 410. Specifically, opening patterns OPR-H, OPG-H, and OPB-H corresponding to the emission areas PA-R, PA-G, and PA-B may be defined on the first insulating layer 410. A plane area of the opening patterns OPR-H, OPG-H, and OPB-H may be greater than a plane area of the corresponding emission areas PA-R, PA-G, and PA-B. These opening patterns OPR-H, OPG-H, and OPB-H may be located in a light extraction direction of the respective pixels Pr, Pg, and Pb, and may enhance linearity of light emitted from the emission areas PA-R, PA-G, and PA-B, so as to improve light extraction efficiency.

Meanwhile, although it is shown that the mesh holes OPR, OPG, and OPB correspond to the emission areas PA-R, PA-G, and PA-B in one-to-one manner, one or more embodiments are not limited thereto. Any of the mesh holes OPR, OPG, and OPB may correspond to at least two of the emission areas PA-R, PA-G, and PA-B. In FIG. 4, the planar shape of the mesh holes OPR, OPG, and OPB have a diamond shape to correspond to shape of the emission areas PA-R, PA-G, and PA-B. However, one or more embodiments are not limited thereto. In another embodiment, for example, the planar shape of the mesh holes OPR, OPG, and OPB may have a polygonal shape that is different from a diamond, and may have, for example, a polygonal shape with round corners.

Although the first sensing electrode SP1 is shown as an example in FIG. 4, the second sensing electrode SP2 may also have substantially the same structure as the first sensing electrode SP1 described with reference to FIG. 4.

Figure 5:
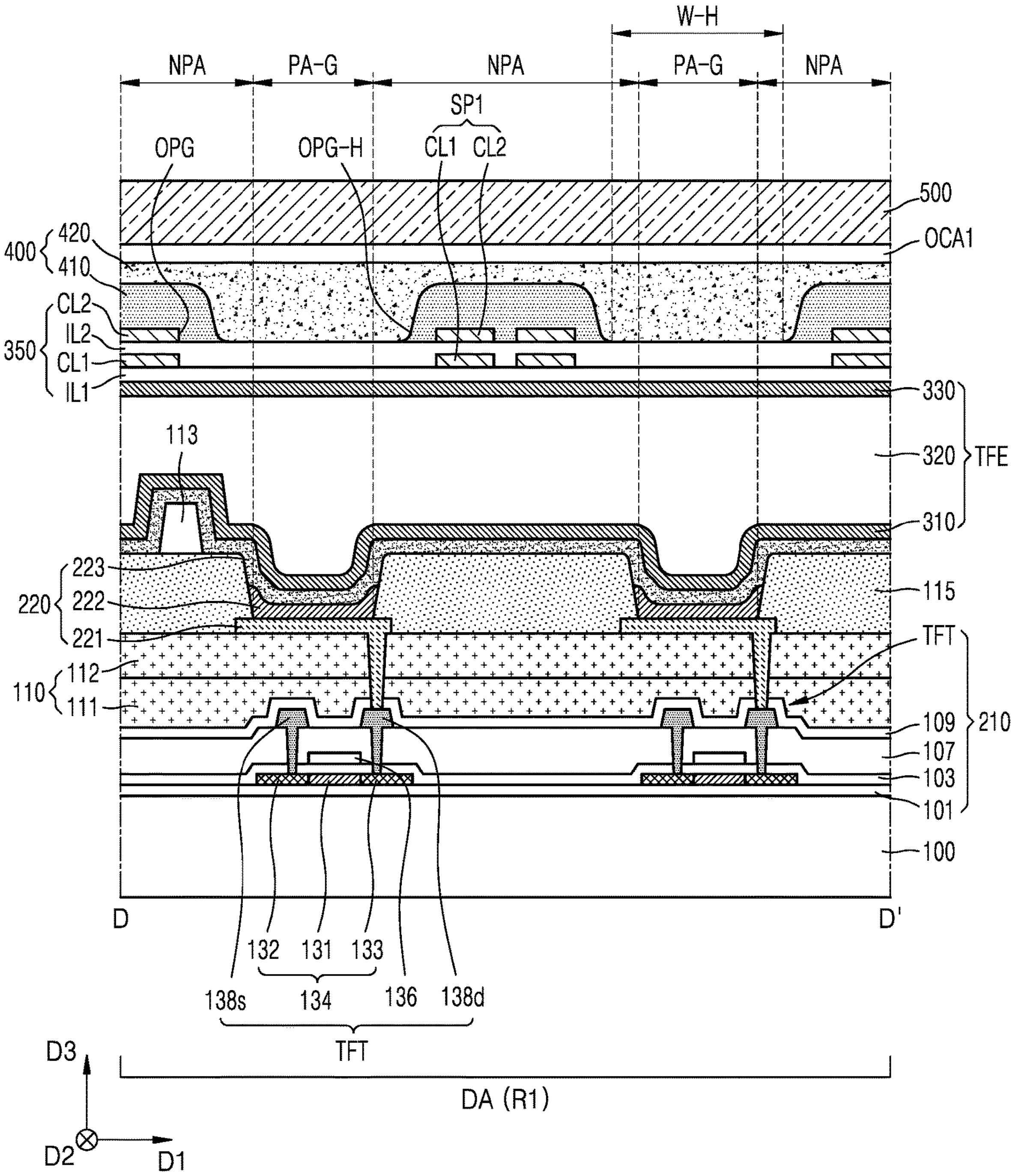
FIG. 5 is a diagram for describing a display apparatus according to one or more embodiments, and is a cross-sectional view taken along line D-D' in FIG. 4.

FIG. 5 is a diagram for describing the display apparatus 1 according to one or more embodiments, and is a cross-sectional view taken along line D-D' in FIG. 4. Reference is also made to FIG. 2 when describing FIG. 5, and redundant descriptions are omitted.

Referring to FIG. 5, the display apparatus 1 may include the substrate 100, the circuit layer 210, the planarization layer 110, the display element layer 220, the pixel-defining layer 115, the thin-film encapsulation layer TFE, the input sensing layer 350, the insulating layer 400, the lower adhesive layer OCA1, and the anti-reflection layer 500. Although not shown, the display apparatus 1 may further include an upper adhesive layer OCA2 and the window layer 550 as described with reference to FIG. 2. The buffer layer 101, the circuit layer 210, the planarization layer 110, the display element layer 220, the pixel-defining layer 115, the thin-film encapsulation layer TFE, the input sensing layer 350, the insulating layer 400, the lower adhesive layer OCA1, the anti-reflection layer 500, the upper adhesive layer OCA2, and the window layer 550 may be provided on the display area DA of the first area R1 of the substrate 100.

The circuit layer 210 may be disposed on the substrate 100, and may include the buffer layer 101, the thin-film transistor TFT, the gate insulating layer 103, an interlayer-insulating film 107, and a protective layer 109. The buffer layer 101 may be provided on the substrate 100. The buffer layer 101 may increase flatness of an upper surface of the substrate 100, or may prevent or minimize permeation of impurities from the substrate 100 into a semiconductor layer 134 of the thin-film transistor TFT. The buffer layer 101 may include an inorganic material, such as an oxide or nitride, or an organic-inorganic compound, and may have a single-layered or multi-layered structure of an inorganic material and an organic material. In an embodiment, the buffer layer 101 may include silicon oxide ($SiO_x$), silicon nitride ($SiN_x$), or/and silicon oxynitride (SiON).

The thin-film transistor TFT may be provided on the buffer layer 101. The thin-film transistor TFT may be the first thin-film transistor T1 or the second thin-film transistor T2 described with reference to FIG. 1C, but is not limited thereto. The thin-film transistor TFT may include the semiconductor layer 134, a gate electrode 136, a source electrode 138*s*, and a drain electrode 138*d*.

The semiconductor layer 134 may include at least one of amorphous silicon (a-Si), polysilicon, an oxide semiconductor, and an organic semiconductor material. In an embodiment, the semiconductor layer 134 may include low temperature polysilicon ("LTPS"). When the semiconductor layer 134 includes polysilicon, the semiconductor layer 134 may exhibit high electron mobility (100 square centimeters per voltage-second ($cm^2/Vs$) or higher), low energy power consumption characteristics, and excellent reliability. The semiconductor layer 134 may include a channel region 131 overlapping the gate electrode 136 in a plan view, and a source region 132 and a drain region 133 arranged at opposite sides of the channel region 131, respectively, and each including a higher concentration of impurities than the channel region 131. Here, the impurities may include n-type impurities or p-type impurities. The source region 132 and the drain region 133 may be understood as part of a source region and part of a drain electrode 138*d* of the thin-film transistor TFT, respectively. The gate electrode 136 may be disposed on the channel region 131, and may be vertically apart from the channel region 131. The gate electrode 136 may have a dual gate structure. In an embodiment, for example, the gate electrode 136 may include a lower gate electrode and an upper gate electrode, which are vertically stacked. The upper gate electrode may be vertically apart from the lower gate electrode. The gate electrode 136 may include a conductive material, such as metal. For example, the gate electrode 136 may include Mo or Al, and may have a multi-layered structure. In an embodiment, for example, the gate electrode 136 may be a single Mo layer. In another example, the gate electrode 136 may have a three-layer structure including a Mo layer, an Al layer, and another Mo layer. When the gate electrode 136 includes lower and upper gates, each of the lower and upper gates may have a single-layered or multi-layered structure.

The gate insulating layer 103 may be arranged between the semiconductor layer 134 and the gate electrode 136. The gate insulating layer 103 may include $SiO_x$, $SiN_x$, or/and SiON, and may be a layer or layers.

The interlayer-insulating film 107 may be disposed on the gate electrode 136. The interlayer-insulating film 107 may include $SiO_x$, $SiN_x$, or/and SiON, and may be a layer or layers. The gate insulating layer 103 may further extend between the buffer layer 101 and the interlayer-insulating film 107.

The thin-film transistor TFT may include the source electrode **138*s* and the drain electrode 138*d* connected to the source region 132 and the drain region 133 of the semiconductor layer 134, respectively. The source electrode 138*s* and the drain electrode 138*d* may be electrically connected to the source region 132 and the drain region 133 of the semiconductor layer 134, respectively, through contact holes passing through the gate insulating layer 103 and the interlayer-insulating film 107**.

Each of the source electrode **138*s* and the drain electrode 138*d* may include Al, Cu, Ti, or the like, and may include a layer or layers. In an embodiment, each of the source electrode 138*s* and the drain electrode 138*d* may have a multi-layered structure of Ti/Al/Ti or TiN/Al/Ti Although not shown, in an embodiment, a data line (DL in FIG. 1B) and a driving voltage line (PL in FIG. 1B) may be on the same layer on which the source electrode 138*s* and the drain electrode 138*d* are disposed, and may include the same material as the source electrode 138*s* and the drain electrode 138*d*.**

The protective layer 109 may be provided on the interlayer-insulating film 107 to cover the interlayer-insulating film 107, the source electrode **138*s*, and the drain electrode 138*d*. The protective layer 109** may prevent a line including a metal, such as Al, that may be damaged by an etchant in a manufacturing process of a display apparatus from being exposed to an etching environment.

The protective layer 109 may extend onto not only the display area DA of the substrate 100, but also the peripheral area PA, the second area R2, or the third area R3 shown in FIG. 1A. Unlike this, the protective layer 109 may be omitted.

The planarization layer 110 may be disposed on the protective layer 109. The planarization layer 110 may include a first planarization layer 111 and a second planarization layer 112. The second planarization layer 112 may be provided on the first planarization layer 111. An upper surface of the planarization layer 110 may not have a step, or may have a step smaller than a step between an upper surface of the thin-film transistor TFT and an upper surface of the interlayer-insulating film 107. Each of the first planarization layer 111 and the second planarization layer 112 may include an insulating organic material, and the insulating organic material may include imide-based polymers, general-purpose polymers, such as poly(methyl methacrylate) ("PMMA") or polystyrene ("PS"), polymer derivatives having phenol-based groups, acryl-based polymers, aryl ether-based polymers, amide-based polymers, fluorine-based polymers, p-xylene-based polymers, vinyl alcohol-based polymers, and/or any combinations thereof. In an embodiment, the planarization layer 110 may include polyimide. In another example, the planarization layer 110 may include acryl, benzocyclobutene ("BCB"), or hexamethyldisiloxane ("HMDSO").

The display element layer 220 may include a plurality of display elements (e.g., organic light-emitting diodes). In an embodiment, for example, the display element layer 220 may include a pixel electrode 221, an intermediate layer 222, and an opposite electrode 223.

The pixel electrode 221 may be disposed on the planarization layer 110. The pixel electrode 221 may be a light-transmitting electrode, a semi-transmissive electrode, or a reflective electrode. In an embodiment, the pixel electrode 221 may include a reflective film and an electrode layer. In this case, the reflective film may include silver (Ag), magnesium (Mg), Al, platinum (Pt), palladium (Pd), gold (Au), nickel (Ni), neodymium (Nd), iridium (Ir), chrome (Cr), and a compound thereof. The electrode layer may be disposed on the reflective film, and may be transparent or semi-transparent. The electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In an embodiment, for example, the pixel electrode 221 may include ITO/Ag/ITO that are stacked.

The pixel-defining layer 115 may be disposed on the pixel electrode 221 and the planarization layer 110. The pixel-defining layer 115 may have an opening OP corresponding to each pixel (P in FIG. 1B). The opening OP of the pixel-defining layer 115 may expose a central portion of the pixel electrode 221 to define the emission area PA-G. In addition, the pixel-defining layer 115 may increase a distance between an edge of the pixel electrode 221 and the opposite electrode 223 to prevent an arc or the like from occurring between the pixel-electrode 221 and the opposite electrode 223. The pixel-defining layer 115 may include an insulating organic material. The insulating organic material may include imide-based polymers, general-purpose polymers, such as PMMA or PS, polymer derivatives having phenol-based groups, acryl-based polymers, aryl ether-based polymers, amide-based polymers, fluorine-based polymers, p-xylene-based polymers, vinyl alcohol-based polymers, and/or a combination thereof. In an embodiment, for example, the pixel-defining layer 115 may include polyimide or HMDSO.

In a selective embodiment, the display apparatus 1 may further include a spacer 113. The spacer 113 may be disposed on the pixel-defining layer 115. The spacer 113 may expose a portion of an upper surface of the pixel-defining layer 115. The spacer 113 may prevent damage to the organic light-emitting diode OLED due to sagging of a mask, in a manufacturing process using the mask. The spacer 113 may include an organic insulating material, and may include a layer or layers. The spacer 113 may be disposed on the display area DA of the substrate 100. Unlike this, the spacer 113 may be disposed on a peripheral area (PA in FIG. 1B) of the substrate 100.

The intermediate layer 222 may be provided on the pixel electrode 221. The intermediate layer 222 may not extend onto the upper surface of the pixel-defining layer 115. The intermediate layer 222 may be a single layer or a multi-layer. The intermediate layer 222 may include a low-molecular weight material or a polymer material.

When the intermediate layer 222 includes a low-molecular weight material, the intermediate layer 222 may include at least one of a hole injection layer ("HIL"), a hole transport layer ("HTL"), an emission layer ("EML"), an electron transport layer ("ETL"), and an electron injection layer ("EIL"). The intermediate layer 222 may include an organic material, such as copper phthalocyanine (CuPc), N,N'-Di (naphthalene-1-yl)-N,N'-diphenyl-benzidine ("NPB"), and/or tris-8-hydroxyquinoline aluminum (Alq3). A layer (layers) included in the intermediate layer 222 may be formed by vacuum deposition.

When the intermediate layer 222 includes a polymer material, the intermediate layer 222 may include an HTL and an EML. In this case, the HTL may include PEDOT, and the EML may include a polymer material, such as poly-phenylenevinylene ("PPV")-based materials or polyfluorene-based materials.

A structure of the intermediate layer 222 is not limited to that described above, and may have various structures. In an embodiment, for example, at least one of the layers included in the intermediate layer 222 may be integrally formed as a single body with the opposite electrode 223. In another embodiment, the intermediate layer 222 may include a patterned layer to correspond to each pixel electrode 221.

The opposite electrode 223 is provided on the intermediate layer 222 and may extend onto the pixel-defining layer 115. The intermediate layer 222 may be located between the opposite electrode 223 and the pixel electrode 221. The opposite electrode 223 may cover the intermediate layer 222 and the pixel-defining layer 115. The opposite electrode 223 may further cover a side wall and an upper surface of the spacer 113.

The opposite electrode 223 may be disposed on the display area of the substrate 100, and may be arranged on an entire surface of the display area DA. In other words, the opposite electrode 223 may be integrally formed as a single body on the entire surface of the display area DA. A portion of the opposite electrode 223 may further extend to the peripheral area (PA in FIG. 1B). The opposite electrode 223 may extend to a partition wall (e.g., a first partition wall PW1 in FIG. 7B) arranged in the peripheral area PA and be in electrical contact with a common voltage supply line.

The thin-film encapsulation layer TFE may be disposed on the opposite electrode 223 to cover the opposite electrode 223. The thin-film encapsulation layer TFE may cover the display area DA of the substrate 100 as a whole, and may be arranged to extend to the peripheral area PA of the substrate 100 in FIGS. 1B and 7B and cover a portion of the peripheral area PA. The thin-film encapsulation layer TFE may extend to the outside of the common voltage supply line.

The thin-film encapsulation layer TFE may include a first inorganic encapsulation layer 310, a second inorganic encapsulation layer 330, and an organic encapsulation layer 320. The first inorganic encapsulation layer 310 may cover the opposite electrode 223. The first inorganic encapsulation layer 310 may include an inorganic insulating material. The inorganic insulating material may include aluminum oxide, titanium oxide, tantalum oxide, hafnium oxide, zinc oxide, silicon oxide, silicon nitride, or/and silicon oxynitride. The first inorganic encapsulation layer 310 may be formed by a chemical vapor deposition method.

The organic encapsulation layer 320 may be disposed on an upper surface of the first inorganic encapsulation layer 310 to cover the upper surface of the first inorganic encapsulation layer 310. The organic encapsulation layer 320 may include a polymer. The polymer may include acryl-based resin, epoxy-based resin, polyimide, and polyethylene. In an embodiment, for example, the organic encapsulation layer 320 may include acryl-based resin, such as PMMA and/or a polyacrylic acid. The organic encapsulation layer 320 may be formed by curing a monomer or applying a polymer. An upper surface of the organic encapsulation layer 320 may be flatter than the upper surface of the first inorganic encapsulation layer 310.

The second inorganic encapsulation layer 330 may be provided on the upper surface of the organic encapsulation layer 320. The second inorganic encapsulation layer 330 may include an inorganic insulating material described in the example of the first inorganic encapsulation layer 310. The second inorganic encapsulation layer 330 may be formed by a chemical vapor deposition method.

The input sensing layer 350 may include a first inorganic insulating layer IL1, a first conductive layer CL1, a second inorganic insulating layer IL2, and a second conductive layer CL2. The first inorganic insulating layer IL1 may be provided on the second inorganic encapsulation layer 330. The first inorganic insulating layer IL1 may have a single-layered or multi-layered structure. The first inorganic insulating layer IL1 may include an inorganic material or a composite material. For example, the first inorganic insulating layer IL1 may include an inorganic film. In an embodiment, the inorganic film may include at least one of aluminum oxide, titanium oxide, silicon oxide, silicon oxynitride, zirconium oxide, and hafnium oxide.

The second inorganic insulating layer IL2 may be provided on the first inorganic insulating layer IL1. The second inorganic insulating layer IL2 may have a single-layered or multi-layered structure. The second inorganic insulating layer IL2 may include an inorganic material or a composite material. For example, the second inorganic insulating layer IL2 may include an inorganic film as described in the example of the first inorganic insulating layer IL1.

The first conductive layer CL1 may be provided on an upper surface of the first inorganic insulating layer IL1. The first conductive layer CL1 may be arranged between the first inorganic insulating layer IL1 and the second inorganic insulating layer IL2.

The second conductive layer CL2 may be disposed on an upper surface of the second inorganic insulating layer IL2. The second conductive layer CL2 may be electrically connected to the first conductive layer CL1 through a contact hole (not shown). The contact hole may be provided in the second inorganic insulating layer IL1.

The first conductive layer CL1 and the second conductive layer CL2 may correspond to the first sensing electrode SP1 described with reference to FIG. 3. As described above, the first sensing electrode SP1 may not overlap the emission area PA-G and may overlap the non-emission area NPA in a plan view. In a plan view, the first conductive layer CL1 and the second conductive layer CL2 may have a mesh structure.

Each of the first conductive layer CL1 and the second conductive layer CL2 may have a single-layered structure or a stacked multi-layered structure. Each of the first conductive layer CL1 and the second conductive layer CL2 may include a metal layer or a transparent conductive layer. The metal layer may include Mo, Ag, Ti, Cu, Al, and an alloy thereof. The transparent conductive layer may include a transparent conductive oxide, such as ITO, IZO, ZnO, and/or ITZO. In another example, the transparent conductive layer may include a conductive polymer, such as PEDOT, metal nanowires, and/or graphene.

The insulating layer 400 may be disposed on the input sensing layer 350. The insulating layer 400 may include a first insulating layer 410 and a second insulating layer 420. The first insulating layer 410 may be disposed on the second inorganic insulating layer IL2 to cover the second conductive layer CL2. The first insulating layer 410 may extend onto the upper surface of the second inorganic insulating layer IL2.

The first insulating layer 410 may have an opening pattern OPG-H. The opening pattern OPG-H may pass through the first insulating layer 410 and expose the upper surface of the second inorganic insulating layer IL2. The opening pattern OPG-H may be defined in the emission area PA-G. A width W-H of the opening pattern OPG-H may be provided to be greater than a width of the emission area PA-G. As described with reference to FIG. 4, a planar area of the opening pattern OPG-H may be greater than a planar area of the emission area PA-G. The opening pattern OPG-H as described above may be located in a light extraction direction of a corresponding pixel from among the pixels (Pg, Pr, and Pb in FIG. 4) to enhance linearity of light emitted from the emission area PA-G, so as to improve light extraction efficiency.

The first insulating layer 410 may have a first refractive index. The first refractive index may be in a range of about 1.3 to about 1.6. In an embodiment, the first refractive index may be in a range of about 1.4 to about 1.55. In an embodiment, for example, the first insulating layer 410 may include (ethyl)hexyl acrylate, pentafluoropropyl acrylate, poly(ethylene glycol) dimethacrylate, or ethylene glycol dimethacrylate. In an embodiment, the first insulating layer 410 may include an acryl-based organic material having a refractive index of about 1.5. In another example, the first insulating layer 410 may include the same material as the organic encapsulation layer 320. In another example, the first insulating layer 410 may include an epoxy-based organic material. In another example, the first insulating layer 410 may include a photocurable material in addition to the epoxy-based organic material.

The second insulating layer 420 may be provided on the first insulating layer 410 and in the opening pattern OPG-H. The second insulating layer 420 may have a second refractive index. Because the second refractive index of the second insulating layer 420 is greater than a first refractive index of the first insulating layer 410, the light extraction efficiency of the display apparatus may be further improved. The second refractive index may be in a range of about 1.65 to about 1.85. In an embodiment, for example, the second insulating layer 420 may include polydiarylsiloxane, methyltrimethoxysilane, or tetramethoxysilane. In an embodiment, the second insulating layer 420 may be provided in an acryl-based and/or siloxane-based organic material having a refractive index of about 1.6. In another embodiment, the second insulating layer 420 may include metal oxide particles and may have a high refractive index. The metal oxide particles may include, for example, zinc oxide ($ZnO_x$), titanium oxide ($TiO_2$), zirconium oxide ($ZrO_2$), and/or titanium barium oxide ($BaTiO_3$). The metal oxide particles may be dispersed within the second insulating layer 420. The second insulating layer 420 may function as a planarization layer. In an embodiment, for example, an upper surface of the second insulating layer 420 may be relatively flat.

The anti-reflection layer 500 may be disposed on the insulating layer 400. As described with reference to FIG. 2, the anti-reflection layer 500 may be attached onto the insulating layer 400 by the lower adhesive layer OCA1. The anti-reflection layer 500 may be substantially the same as described in the example of the anti-reflection layer 500 of FIG. 2.

Figure 6:
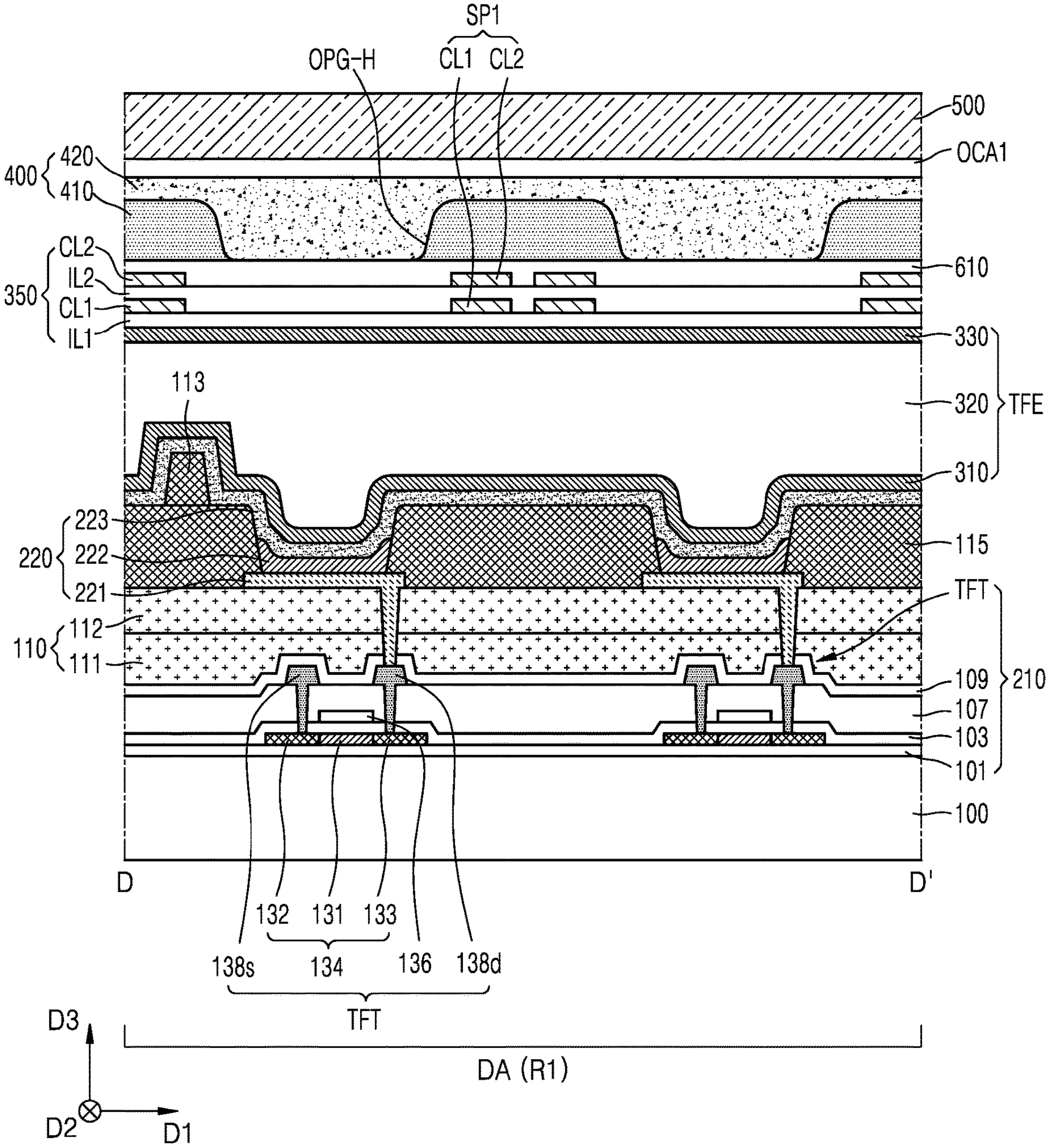
FIG. 6 is a diagram for describing a display apparatus according to another embodiment, and corresponds to a cross-section taken along line D-D' in FIG. 4.

FIG. 6 is a diagram for describing a display apparatus 1 according to another embodiment, and corresponds to a cross-section taken along line D-D' in FIG. 4.

Referring to FIG. 6, the display apparatus 1 may include the substrate 100, the circuit layer 210, the planarization layer 110, the display element layer 220, the pixel-defining layer 115, the thin-film encapsulation layer TFE, the input sensing layer 350, the insulating layer 400, the lower adhesive layer OCA1, and the anti-reflection layer 500.

The pixel-defining layer 115 and the spacer 113 may be identical or similar to those described in the example of FIG. 5A, respectively. However, at least one of the pixel-defining layer 115 and the spacer 113 may include a black light-shielding material. In this case, at least one of the pixel-defining layer 115 and the spacer 113 may include a black matrix.

Figure 7A:
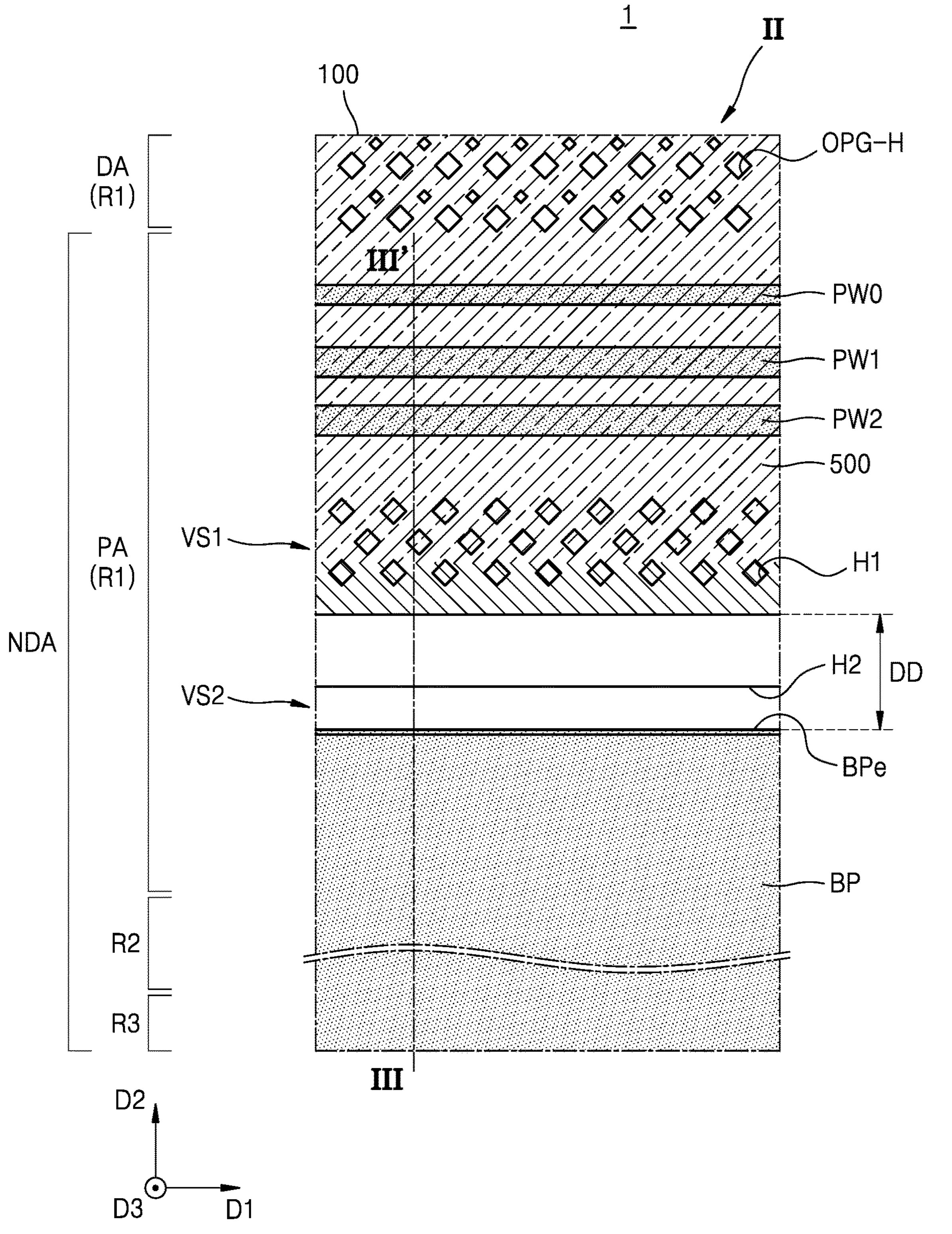
FIG. 7A is a plan view schematically illustrating a partial configuration of a display apparatus according to one or more embodiments, and is an enlarged view of region II in FIG. 1B.
Figure 7B:
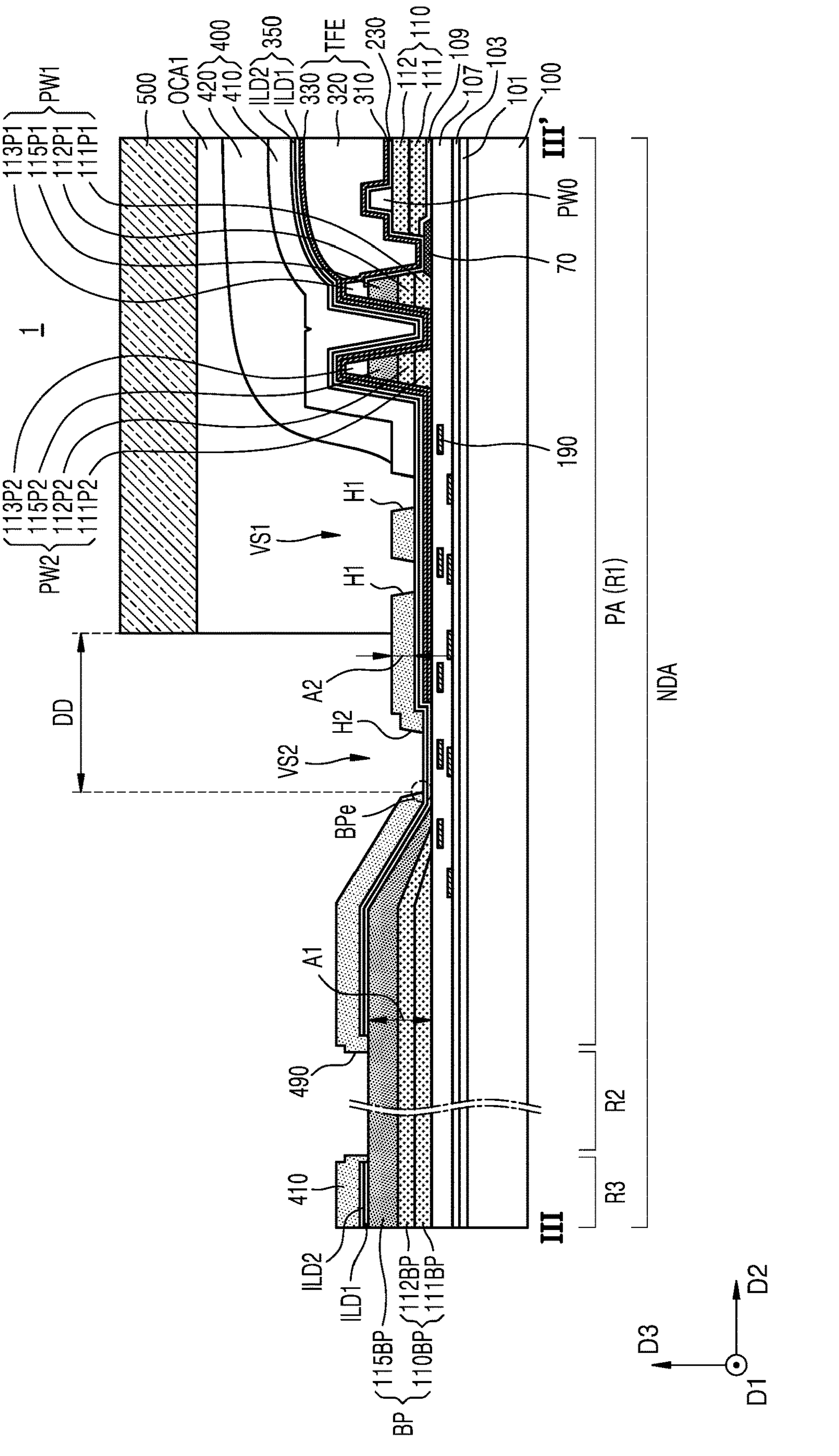
FIG. 7B is a cross-sectional view taken along line III-III' in FIG. 7A.

FIG. 7A is a plan view schematically illustrating a display apparatus 1 according to one or more embodiments, and is an enlarged view of region II in FIG. 1B. FIG. 7B is a cross-sectional view taken along line III-III' in FIG. 7A. FIGS. 7A and 7B are views in an unfolded state of the second area R2.

Referring to FIGS. 7A and 7B, the substrate 100 of the display apparatus 1 may include the first area R1, the second area R2, and the third area R3. The first area R1 of the substrate 100 may include the display area DA and the peripheral area PA. Elements on the first area R1 of the substrate 100 are as described above with reference to FIGS. 2, 5, and 6. Hereinafter, elements on the peripheral area PA, the second area R2, and the third area R3 of the substrate 100 are described in greater detail.

An auxiliary partition wall PW0, a first partition wall PW1, and a second partition wall PW2 may be provided on the peripheral area PA of the substrate 100. The auxiliary partition wall PW0 may be arranged adjacent to the display area DA of the substrate 100. The first partition wall PW1 may be arranged between the auxiliary partition wall PW0 and the second partition wall PW2. The second partition wall PW2 may be arranged between the first partition wall PW1 and the second area R2 of the substrate 100. The auxiliary partition wall PW0, the first partition wall PW1, and the second partition wall PW2 may be apart from each other by a certain distance.

A first portion 111P1 of the first planarization layer 111, a first portion 112P1 of the second planarization layer 112, a first portion 115P1 of the pixel-defining layer 115, and a first portion 113P1 of the spacer 113 may be included in the first partition wall PW1.

A second portion 111P2 of the first planarization layer 111, a second portion 112P2 of the second planarization layer 112, a second portion 115P2 of the pixel-defining layer 115, and a second portion 113P2 of the spacer 113 may be included in the second partition wall PW2.

The auxiliary partition wall PW0 may be disposed on an upper surface of the first planarization layer 111. The auxiliary partition wall PW0 may be a portion of the pixel-defining layer 115 or a portion of the spacer 113. Accordingly, the auxiliary partition wall PW0 may include the same material as the pixel-defining layer 115 or the spacer 113. In another embodiment, the auxiliary partition wall PW0 may be disposed on the interlayer-insulating film 107. In this case, the auxiliary partition wall PW0 may include the same material as the planarization layer 110.

In a plan view, the first partition wall PW1 and the second partition wall PW2 may be arranged to surround the display area DA of the substrate 100. The first partition wall PW1 and the second partition wall PW2 may prevent the organic encapsulation layer 320 from overflowing toward the second area R2 of the substrate 100. The first inorganic encapsulation layer 310 may be in contact with an inner surface of the first partition wall PW1, and in a plan view, the inner surface of the first partition wall PW1 may be a side wall facing the display area DA of the substrate 100. The first inorganic encapsulation layer 310 and the second inorganic encapsulation layer 330 may be disposed on the first partition wall PW1 and the second partition wall PW2, but may not extend onto the second area R2 of the substrate 100. Accordingly, even when the second area R2 of the substrate 100 is bent, the first inorganic encapsulation layer 310 and the second inorganic encapsulation layer 330 may be prevented from being damaged.

The valley structures VS1 and VS2 may be provided on the non-display area NDA of the substrate 100. In an embodiment, for example, the valley structures VS1 and VS2 may be provided on the peripheral area PA of the substrate 100. The valley structures VS1 and VS2 may be arranged outside the second partition wall PW2, and may be arranged between the second partition wall PW2 and the second area R2 of the substrate 100. The valley structures VS1 and VS2 may include a first valley structure VS1 and a second valley structure VS2.

The first valley structure VS1 may be arranged adjacent to the display area DA of the substrate 100, as in FIG. 7A. First valley holes H1 may be provided in plurality. As in FIG. 7A, in a plan view, the plurality of first valley holes H1 may be arranged along a plurality of rows. The rows may be parallel to the first direction D1. The first valley holes H1 in an (n+1)th row may be arranged to be offset in the first direction or in an opposite direction of the first direction D1 from the first valley holes H1 in an n-th row (n is a natural number of 1 or more) so that first valley holes H1 in the (n+1)th row may be located between the first valley holes H1 in the n-th row in a view in the second direction R2.

The first valley structure VS1 may be formed by removing a portion of the first insulating layer 410, as in FIG. 7B. For example, the first insulating layer 410 may have the first valley holes, and the first valley structure VS1 may be defined by the first valley holes H1. For example, the first valley structure VS1 may have the first valley holes H1. The first valley holes H1 may pass through upper and lower surfaces of the first insulating layer 410. In this case, the first valley holes H1 may expose the upper surface of the second inorganic insulating layer IL2. Unlike this, the first valley holes H1 may pass through the upper surface of the first insulating layer 410, but may not pass through the lower surface of the first insulating layer 410. In other words, the first valley holes H1 may be a portion recessed from the upper surface of the first insulating layer 410, and bottom surfaces of the first valley holes H1 may be provided within the first insulating layer 410.

The second valley structure VS2 may be arranged between the second area R2 of the substrate 100 and the second valley structure VS2. The second valley structure VS2 may be formed by removing a portion of the first insulating layer 410. In an embodiment, for example, the first insulating layer 410 may have a second valley hole H2, and the second valley structure VS2 may be defined by the second valley hole H2. For example, the second valley structure VS2 may have the second valley hole H2. The second valley hole H2 may pass through the upper and lower surfaces of the first insulating layer 410. In this case, the second valley hole H2 may expose the upper surface of the second inorganic insulating layer IL2. Unlike this, the second valley hole H2 may pass through the upper surface of the first insulating layer 410, but may not pass through the lower surface of the first insulating layer 410.

As in FIG. 7A, a planar shape of the second valley hole H2 may be different from a planar shape of the first valley holes H1. In an embodiment, for example, the second valley hole H2 may have a bar shape extending in parallel to the first direction D1 in a plan view.

Figure 10A:
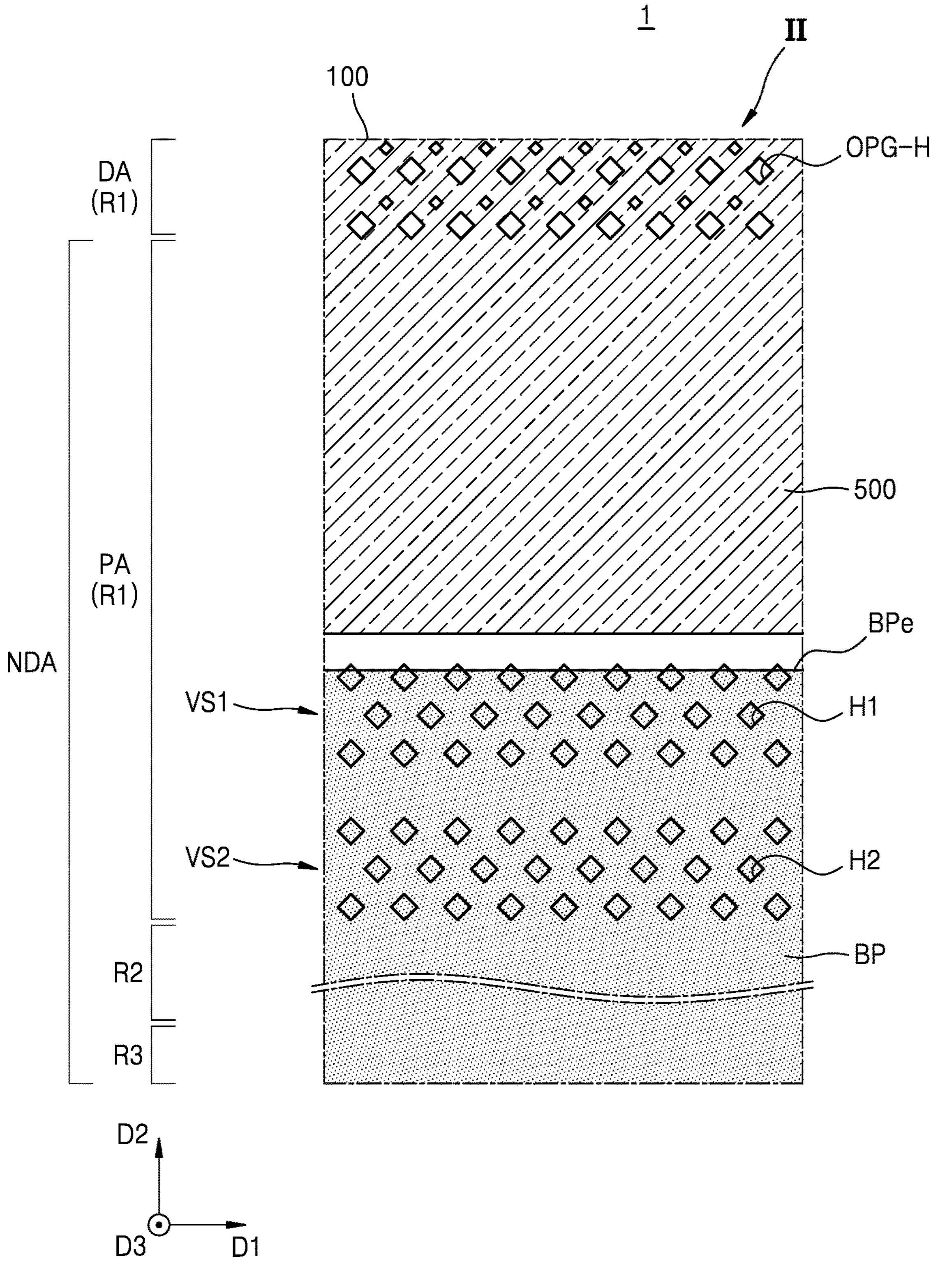
FIG. 10A is a plan view for describing valley structures according to another embodiment, and corresponds to an enlarged view of region II in FIG. 1B.
Figure 10B:
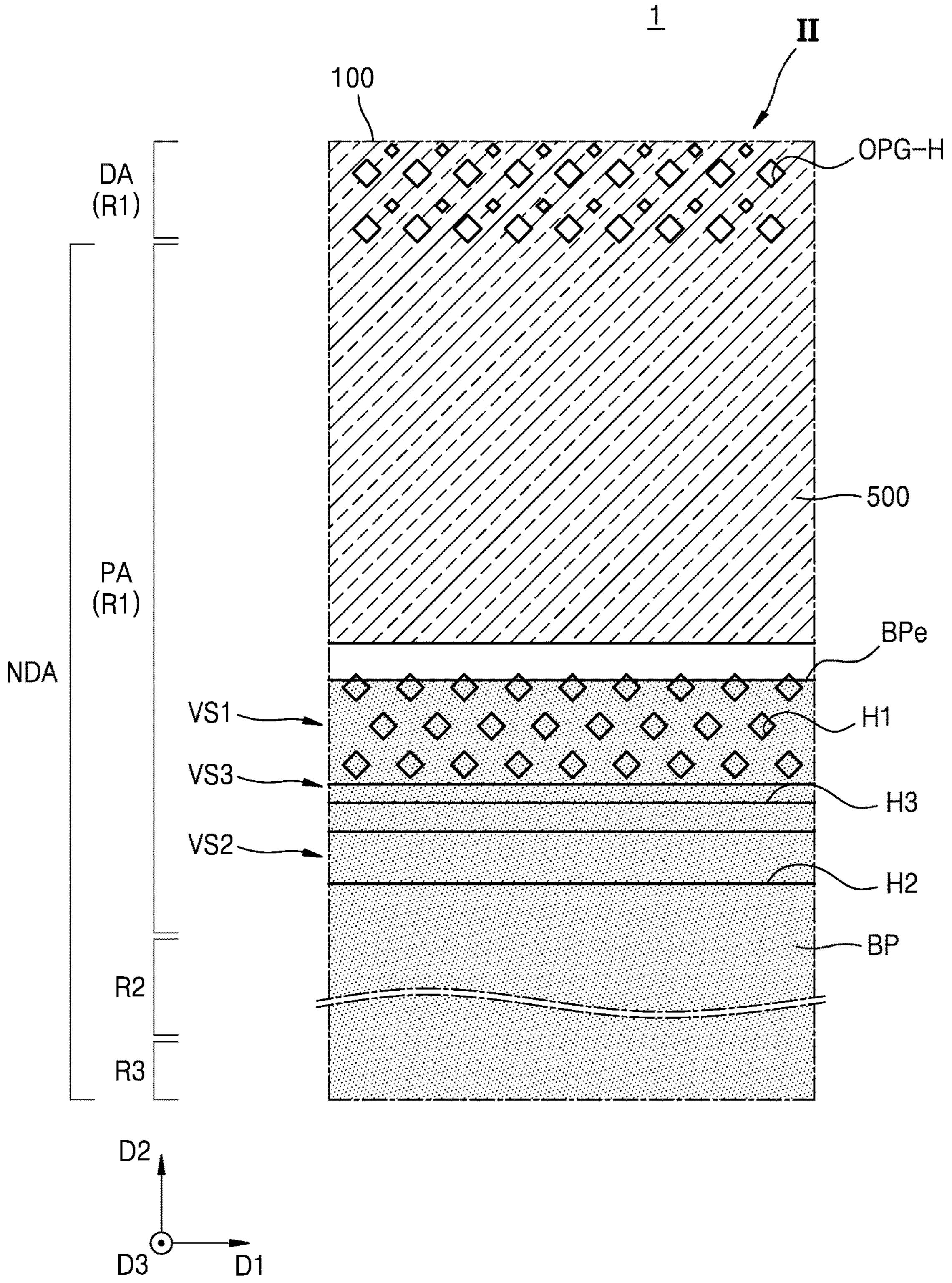
FIG. 10B is a plan view for describing valley structures according to still another embodiment, and corresponds to an enlarged view of region II in FIG. 1B.
Figure 10C:
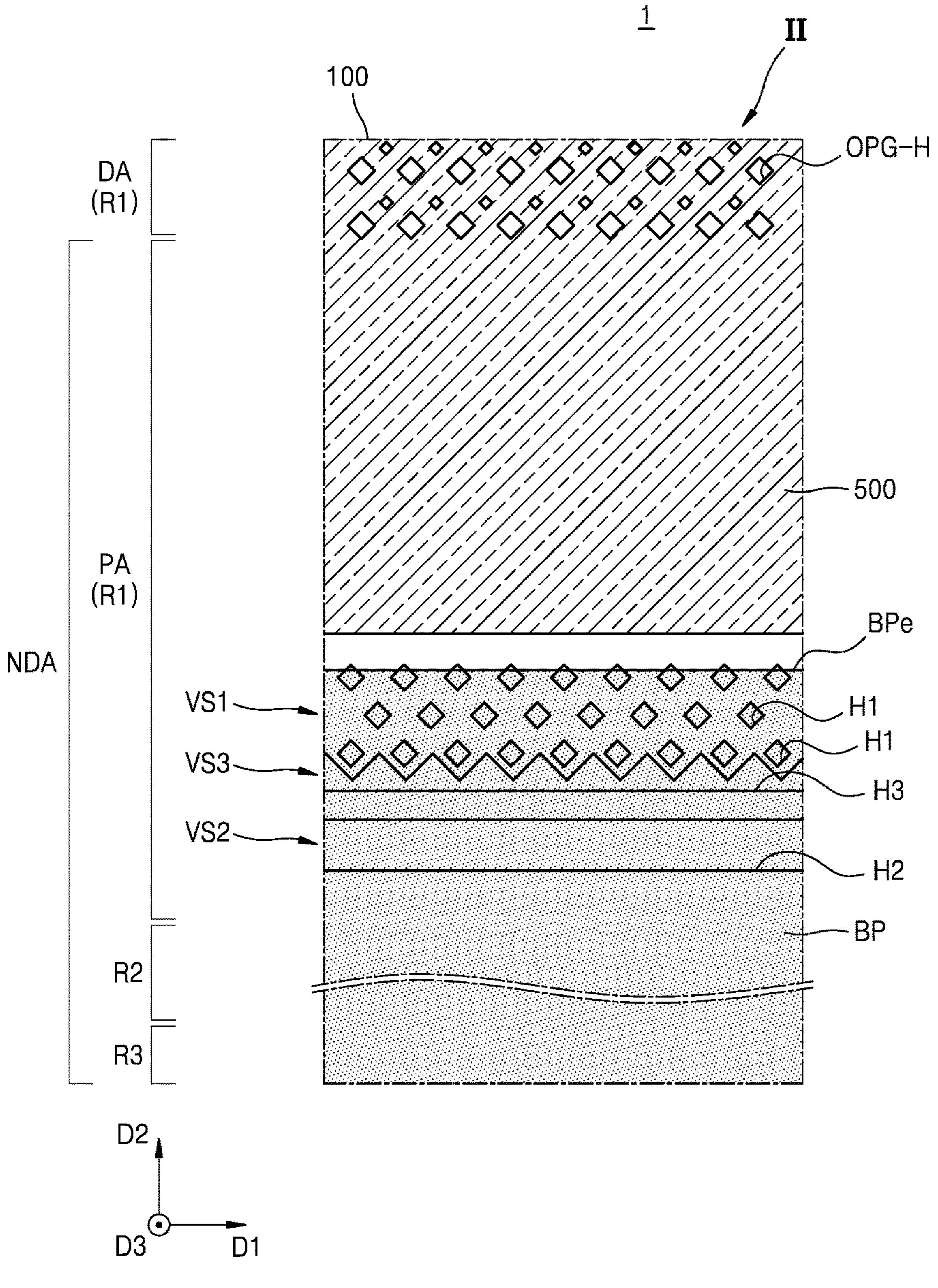
FIG. 10C is a plan view for describing valley structures according to yet another embodiment, and corresponds to an enlarged view of region II in FIG. 1B.

Planar shapes of the first valley structure VS1 and the second valley structure VS2 may be variously modified, and this is described in embodiments of FIGS. 10A to 10C.

Unlike shown, any of the first valley structure VS1 and the second valley structure VS2 may be omitted.

The second insulating layer 420 may be provided on the display area DA of the substrate 100 and may extend to the peripheral area PA of the substrate 100. The second insulating layer 420 may be provided on the auxiliary partition wall PW0, the first partition wall PW1 and the second partition wall PW2.

The second insulating layer 420 may be formed on the first insulating layer 410 by an inkjet printing method using an organic insulating material having high spreadability. In a process of forming the second insulating layer 420, a material of the second insulating layer 420 may excessively flow toward the second area R2 of the substrate 100. The overflow of the second insulating layer 420 may be controlled by the first valley structure VS1 having the first valley holes H1 and the second valley structure VS2 having the second valley hole H2. In an embodiment, for example, the second insulating layer 420 may be prevented from flowing onto the second area R2 the substrate 100 by the first valley holes H1 of the first valley structure VS1 and the second valley hole H2 of the second valley structure VS2. Accordingly, the second insulating layer 420 may be apart from the first valley structure VS1, and an end of the second insulating layer 420 may be apart from the first valley holes H1. An end of the second insulating layer 420 may be arranged between the second partition wall PW2 and the first valley structure VS1. Unlike this, the second insulating layer 420 may extend onto some of the first valley holes H1, but may not extend into the other first valley holes H1. In another example, the second insulating layer 420 may extend into the first valley holes H1, but may not extend into the second valley hole H2. In other words, the second insulating layer 420 may overlap the first valley holes H1 in a plan view, but may be apart from the second valley hole H2.

In a plan view, each of the first valley holes H1 may have a diamond shape. When each of the first valley holes H1 has a diamond shape, any vertex of the diamond may face in the second direction D2, as in FIG. 7A. In an inkjet printing process for forming the second insulating layer 420, the second insulating layer 420 may flow in an opposite direction of the second direction D2. Accordingly, pressure of an end of the second insulating layer 420 may be more effectively distributed by the first valley holes H1. Accordingly, the overflow of the second insulating layer 420 may be controlled more easily. Unlike this, the planar shapes of the first valley holes H1 may be variously modified, such as a circle, an ellipse, a triangle, a hexagon, and/or an octagon.

As in FIG. 7B, the buffer layer 101, the gate insulating layer 103, and the interlayer-insulating film 107 may be provided on the first area R1, the second area R2, and the third area R3 of the substrate 100. The buffer layer 101, the gate insulating layer 103, and the interlayer-insulating film 107 on the second and third areas R2 and R3 of the substrate 100 may be connected to the buffer layer 101, the gate insulating layer 103, and the interlayer-insulating film 107 on the display area DA of the substrate 100 in FIG. 2, respectively.

Conductive lines 190 may be provided on the peripheral area PA of the substrate 100. The conductive lines 190 may be electrically connected to the scan lines SL in FIG. 1B. The conductive lines 190 may be formed by a single process together with the gate electrode 136 in FIGS. 5A to 5D. A material and a thickness of the conductive lines 190 may be identical to a material and a thickness of the gate electrode 136, respectively. When the gate electrode 136 includes a lower gate electrode and an upper gate electrode, the conductive lines 190 may include lower lines and upper lines on the lower lines. In this case, the upper lines may be formed by a single process with the upper gate electrode and thus may include the same material as the upper gate electrode, and the lower lines may be formed by a single process with the lower gate electrode and thus may include the same material as the lower gate electrode. However, the conductive lines 190 may be electrically separated from the gate electrode 136.

An organic layer may be provided on the second area R2 and the third area R3 of the substrate 100 to overlap the second area R2 and the third area R3 of the substrate 100 in a plan view. The organic layer BP may extend onto the first area R1 of the substrate 100, and an end BPe of the organic layer BP may be disposed on the peripheral area PA of the substrate 100. The organic layer BP may include a first organic layer 110BP and a second organic layer 115BP. The first organic layer 110BP may include a first lower organic layer 111BP and a first upper organic layer 112BP that are stacked.

The first lower organic layer 111BP may be disposed on the second inorganic insulating layer IL2. The first lower organic layer 111BP is formed by a single process with the first planarization layer 111 on the display area DA of the substrate 100 in FIGS. 5A to 5D, but may be apart from the first planarization layer 111 on the display area DA of the substrate 100. Here, when two elements are apart from each other, it may mean that the two elements are apart from each other in one cross-section. However, one or more embodiments are not limited thereto. The first lower organic layer 111BP may include the same material as the first planarization layer 111 on the display area DA of the substrate 100.

The first upper organic layer 112BP is formed by a single process with the second planarization layer 112 on the display area DA of the substrate 100 in FIGS. 5A to 5D, but may be apart from the second planarization layer 112 on the display area DA of the substrate 100. The first upper organic layer 112BP may include the same material as the second planarization layer 112 on the display area DA of the substrate 100.

The second organic layer 115BP is formed by a single process as the pixel-defining layer 115 on the display area DA of the substrate 100 in FIGS. 5A to 5D, but may be apart from the pixel-defining layer 115 on the display area DA of the substrate 100. The second organic layer 115BP may include the same material as the pixel-defining layer 115 on the display area DA of the substrate 100.

The first inorganic insulating layer IL1 and the second inorganic insulating layer IL2 may be provided on the peripheral area PA and the third area R3 of the substrate 100. The first inorganic insulating layer IL1 and the second inorganic insulating layer IL2, which are outside the second valley structure VS2, may be provided on an upper surface of the organic layer BP. The first inorganic insulating layer IL1 and the second inorganic insulating layer IL2 on the peripheral area PA of the substrate 100 may extend between the organic layer BP and the first insulating layer 410. The first inorganic insulating layer IL1 and the second inorganic insulating layer IL2 on the third area R3 of the substrate 100 may be provided on the upper surface of the organic layer BP. The upper surface of the organic layer BP may be an upper surface of the second organic layer 115BP. The first inorganic insulating layer IL1 and the second inorganic insulating layer IL2 may not be provided on the second area R2 of the substrate 100. In an embodiment, for example, a through groove may pass through the first inorganic insulating layer IL1 and the second inorganic insulating layer IL2 on the second area R2 of the substrate 100, to expose the upper surface of the organic layer BP. Accordingly, even when the second area R2 of the substrate 100 is bent, damage to the first inorganic insulating layer IL1 and the second inorganic insulating layer IL2 may be prevented.

The first insulating layer 410 may be provided on the first area R1 and the third area R3 of the substrate 100. The first insulating layer 410 may cover the second inorganic insulating layer IL2 on the first area R1 of the substrate 100. The first insulating layer 410 may cover the upper surface of the organic layer BP on the third area R3 of the substrate 100.

The first insulating layer 410 may define a bending groove 490 therein, and the bending groove 490 may be provided on the second area R2 of the substrate 100. The bending groove 490 may expose the upper surface of the organic layer BP. The first inorganic insulating layer IL1 and the second inorganic insulating layer IL2 may not be exposed by the bending groove 490. The bending groove 490 may be apart from the first valley holes H1 and the second valley hole H2.

The anti-reflection layer 500 may be provided on at least a portion of the peripheral area PA of the substrate 100 and on the pixel area DA. As in FIG. 7A, the anti-reflection layer 500 on the peripheral area PA may be connected to the anti-reflection layer 500 on the pixel area DA. As in FIG. 7B, the lower adhesive layer OCA1 may be between the anti-reflection layer 500 and the insulating layer 400. The formation of the anti-reflection layer 500 may include preparing the anti-reflection layer 500 to which the lower adhesive layer OCA is coupled, arranging the anti-reflection layer 500 such that the lower adhesive layer OCA1 faces the insulating layer 400, and attaching the lower adhesive layer OCA1 to the insulating layer 400 by applying pressure to the anti-reflection layer 500. Hereinafter, a process of attaching the anti-reflection layer 500 may mean attaching the lower adhesive layer OCA1 to which the anti-reflection layer 500 is coupled to the insulating layer 400.

A thickness A1 of the organic layer BP may be relatively large. In this case, the thickness A1 of the organic layer BP may be a maximum thickness of the organic layer BP on the peripheral area PA of the substrate 100. The thickness A1 of the organic layer BP may be greater than a thickness A2 of the first insulating layer 410 on the peripheral area PA of the substrate 100. For example, the thickness A1 of the organic layer BP may be 5 micrometers (μm) to 15 μm, and the thickness A2 of the first insulating layer 410 on the peripheral area PA of the substrate 100 may be 0.5 μm to 3 μm. The thickness A1 of the organic layer BP may be a sum of a thickness of the first lower organic layer 111BP, a thickness of the first upper organic layer 112BP, and a thickness of the second organic layer 115BP.

When the end BPe of the organic layer BP is provided under the anti-reflection layer 500, pressure may be applied to the end BPe of the organic layer BP in the formation process of the anti-reflection layer 500. The organic layer BP may have a relatively large thickness A1 so that pressure may be concentrated on the end BPe of the organic layer BP. In this case, a gap or cracks may occur between the interlayer-insulating film 107 adjacent to the organic layer BP and the first inorganic insulating layer IL1 and between the first inorganic insulating layer IL1 adjacent to the organic layer BP and the second inorganic insulating layer IL2. When an operation of the display apparatus 1 is repeated, impurities, such as moisture, may permeate into the gap or cracks, thus damaging the conductive lines 190. Damage to the conductive lines 190 may include corrosion of the conductive lines 190.

According to one or more embodiments, the organic layer BP may not be provided between the anti-reflection layer 500 and the substrate 100. In this case, in a plan view, the anti-reflection layer 500 may be apart from the organic layer BP. Accordingly, in the attachment process of the anti-reflection layer 500, pressure may not be applied to the end BPe of the organic layer BP. A minimum distance DD between the organic layer BP and the anti-reflection layer 500 in a plan view may be 0.0001 μm or more. According to one or more embodiments, durability of the display apparatus 1 may be effectively improved, and damage to the conductive lines 190 may be prevented. The display apparatus 1 may implement improved image quality.

In a plan view, the anti-reflection layer 500 may overlap at least one of the first valley holes H1 and the second valley hole H2. In an embodiment, for example, the anti-reflection layer 500 may be provided on the first valley holes H1, but may not be provided on the second valley hole H2. In another example, the anti-reflection layer 500 may be provided on the first valley holes H1 and the second valley hole H2. The first insulating layer 410 may have a relatively small thickness A2, and thus, the first valley holes H1 and the second valley hole H2 may not be damaged in the attachment process of the anti-reflection layer 500.

A planar arrangement of the lower adhesive layer OCA1 may be identical or similar to a planar arrangement of the anti-reflection layer 500. For example, in a plan view, the lower adhesive layer OCA1 may be apart from the organic layer BP. The lower adhesive layer OCA1 may overlap at least one of the first valley holes H1 and the second valley hole H2 in a plan view.

The first inorganic encapsulation layer 310 and/or the second inorganic encapsulation layer 330 may be provided on the peripheral area PA of the substrate 100. The first inorganic encapsulation layer 310 and the second inorganic encapsulation layer 330 may not extend onto the second area R2 or the third area R3 of the substrate 100.

In FIGS. 8A, 9A, 10A, 10B, and 10C, for brevity, the auxiliary partition wall PW0, the first partition wall PW1, and the second partition wall PW2 are omitted. However, one or more embodiments are not limited thereto.

Figure 8A:
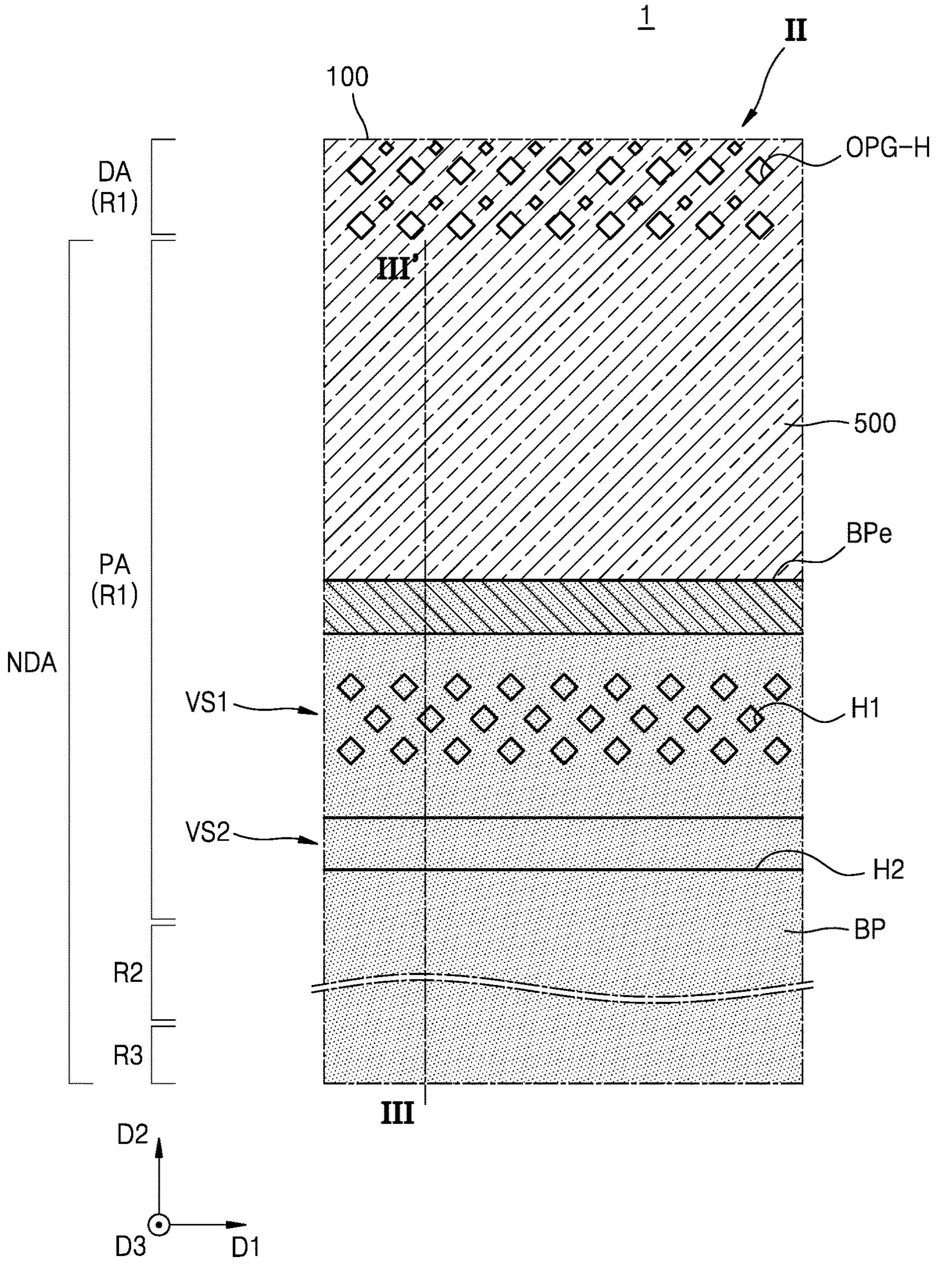
FIG. 8A is a plan view schematically illustrating a partial configuration of a display apparatus according to other embodiments, and corresponds to an enlarged view of region II in FIG. 1B.
Figure 8B:
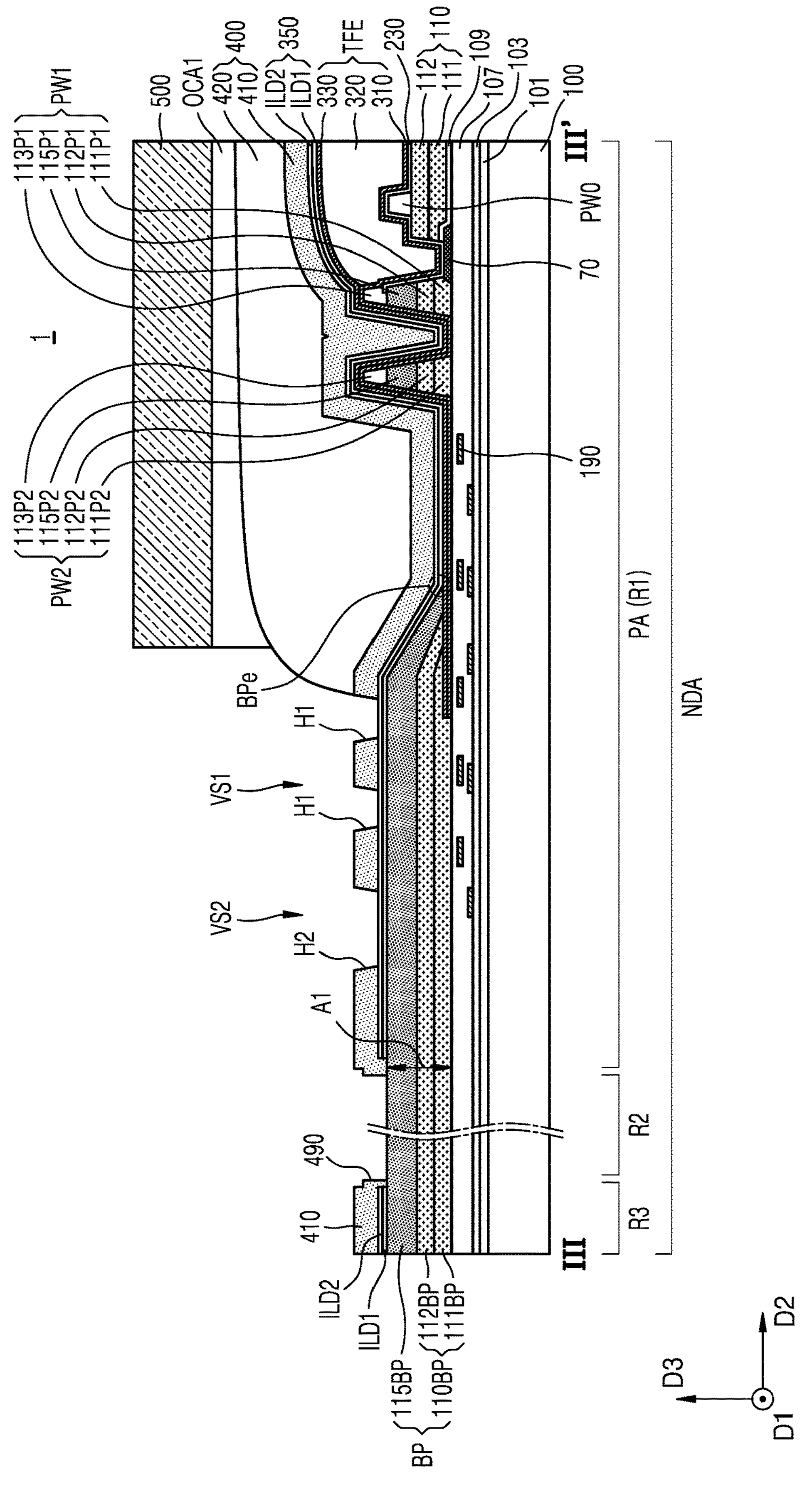
FIG. 8B is a cross-sectional view taken along line III-III' in FIG. 8A.

FIG. 8A is a plan view schematically illustrating a partial configuration of the display apparatus 1 according to other embodiments, and corresponds to an enlarged view of region II in FIG. 1B. FIG. 8B is a cross-sectional view taken along line III-III' in FIG. 8A. FIGS. 8A and 8B are views in an unfolded state of the second area R2. Hereinafter, descriptions that overlap with those provided above are omitted.

Referring to FIGS. 8A and 8B, in a plan view, the first valley structure VS1 and the second valley structure VS2 may be apart from the anti-reflection layer 500. In an embodiment, for example, the first valley holes H1 and the second valley hole H2 may be arranged outside the anti-reflection layer 500. Accordingly, in the attachment process of the anti-reflection layer 500, pressure may not be concentrated on the first insulating layer 410 adjacent to the first valley structure VS1 and the second valley structure VS2 Accordingly, a gap or cracks may be prevented from occurring between the second inorganic insulating layer IL2 adjacent to the first valley structure VS1 or the second valley structure VS2 and the interlayer-insulating film 107.

In a plan view, at least a portion of the organic layer BP may overlap the anti-reflection layer 500. The end BPe of the organic layer BP may be provided between the anti-reflection layer 500 and the substrate 100. The second insulating layer 420 may extend between the organic layer BP and the anti-reflection layer 500 and vertically overlap the end BPe of the organic layer BP in a plan view. The second insulating layer 420 may further extend toward the outside of the anti-reflection layer 500. According to an embodiment, because the second insulating layer 420 may extend between the end PBe of the organic layer BP and the anti-reflection layer 500, pressure may not be concentrated on the end BPe of the organic layer BP in the attachment process of the anti-reflection layer 500. Accordingly, a gap or cracks may be prevented from occurring between the second inorganic insulating layer IL2 and the interlayer-insulating film 107. The display apparatus 1 may have improved durability and improved image characteristics.

In a plan view, the lower adhesive layer OCA1 may be apart from the first valley holes H1 and the second valley hole H2. In a plan view, the lower adhesive layer OCA1 may overlap at least a portion of the organic layer BP.

Figure 9A:
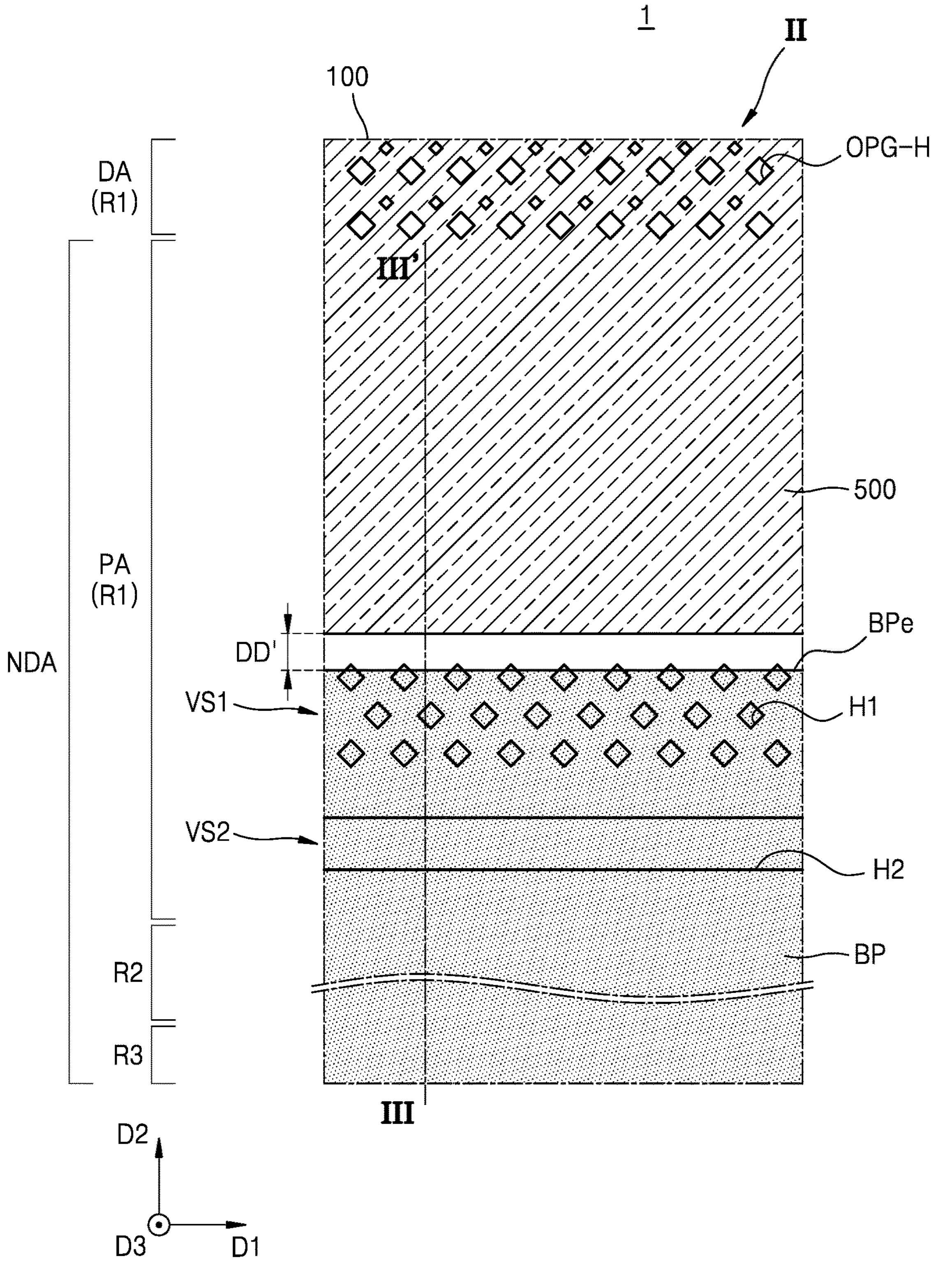
FIG. 9A is a plan view schematically illustrating a partial configuration of a display apparatus according to other embodiments, and corresponds to an enlarged view of region II in FIG. 1B.
Figure 9B:
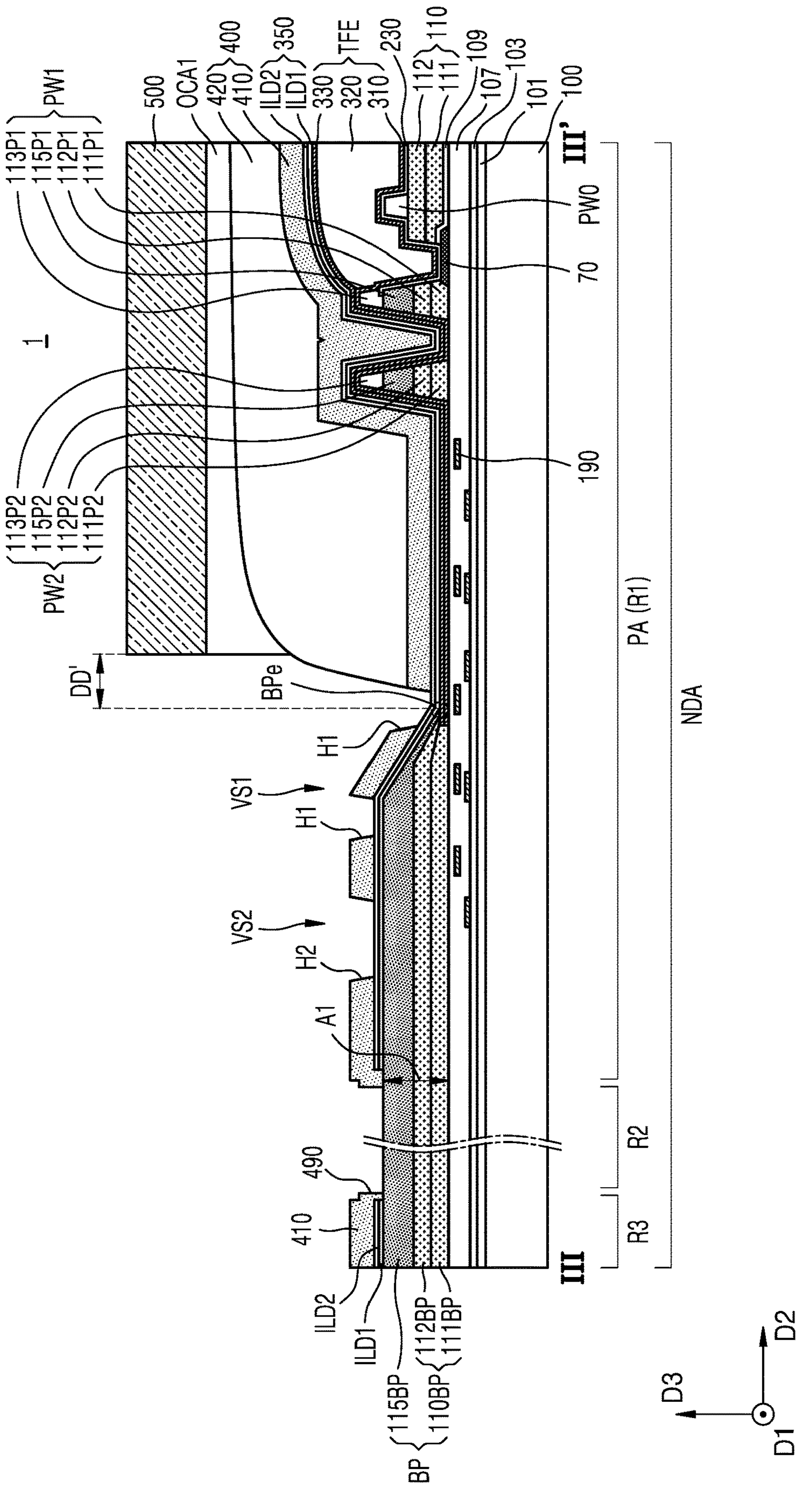
FIG. 9B is a cross-sectional view taken along line III-III' in FIG. 9A.

FIG. 9A is a plan view schematically illustrating a partial configuration of the display apparatus 1 according to other embodiments, and corresponds to an enlarged view of region II in FIG. 1B. FIG. 9B is a cross-sectional view taken along line III-III' in FIG. 9A. FIGS. 9A and 9B are views in an unfolded state of the second area R2.

Referring to FIGS. 9A and 9B, in a plan view, the anti-reflection layer 500 may be apart from at least one of the organic layer BP and the valley structures VS1 and VS2. According to one or more embodiments, in a plan view, the anti-reflection layer 500 may be apart from the organic layer BP. The end BPe of the organic layer BP may not be provided between the anti-reflection layer 500 and the substrate 100. Accordingly, even when the display apparatus 1 is operated for a long period of time, damage to the conductive lines 190 may be prevented. A minimum distance DD' between the organic layer BP and the anti-reflection layer 500 in a plan view may be 0.0001 μm or more.

In a plan view, the first valley holes H1 and the second valley hole H2 may be apart from the anti-reflection layer 500. In a plan view, the first valley structure VS1 and the second valley structure VS2 may be arranged outside the anti-reflection layer 500. The display apparatus 1 may have improved durability and may exhibit improved image characteristics.

In a plan view, the lower adhesive layer OCA1 may be apart from the organic layer BP. In a plan view, the lower adhesive layer OCA1 may be apart from the first valley holes H1 and the second valley hole H2.

Figure 9C:
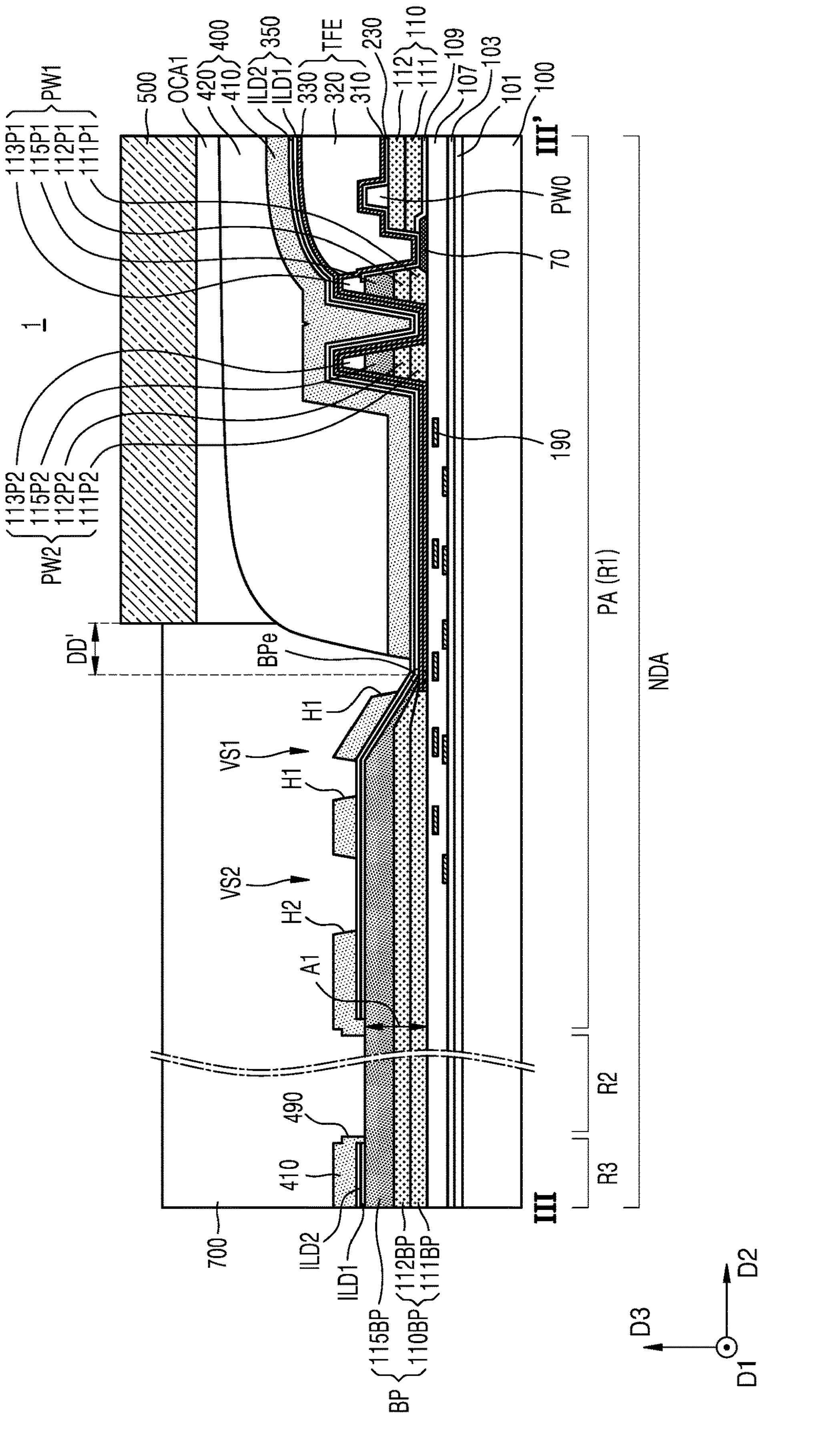
FIG. 9C is a cross-sectional view taken along line III-III' in FIG. 9A according to another embodiment.

FIG. 9C is a diagram for describing the display apparatus 1 according to other embodiments, and corresponds to a cross-section taken along line III-III' in FIG. 9A. FIG. 9C is a view in an unfolded state of the second area R2. Hereinafter, descriptions that overlap with those provided above are omitted.

Referring to FIG. 9C, the display apparatus 1 may further include an organic protective layer 700. The organic protective layer 700 may be provided on the peripheral area PA and the second area R2 of the substrate 100 and may cover the first insulating layer 410. The organic protective layer 700 may be provided within the bending groove 490. The organic protective layer 700 may further extend into the first valley holes H1 and the second valley hole H2. The organic protective layer 700 may have flexible, rollable, or bendable properties. When the second area R2 of the substrate 100 is bent, the organic protective layer 700 may protect the first insulating layer 410 and the organic layer BP. The organic protective layer 700 may not be provided on the anti-reflection layer 500.

The display apparatus 1 of FIGS. 7A and 7B and the display apparatus 1 of FIGS. 8A and 8B may each further include the organic protective layer 700 described with reference to FIG. 9C.

According to one or more embodiments, the valley structures may be variously modified. Hereinafter, planes of valley structures according to other embodiments are described.

FIG. 10A is a plan view for describing valley structures according to other embodiments, and corresponds to an enlarged view of region II in FIG. 1B. FIG. 10A is a view in an unfolded state of the second area R2. Hereinafter, descriptions that overlap those described above are omitted.

Referring to FIG. 10A, the first insulating layer 410 may include the first valley structure VS1 and the second valley structure VS2. The second valley structure VS2 may be defined by a plurality of second valley holes H2. Shapes of the second valley holes H2 of the second valley structure VS2 may be identical or similar to shapes of the first valley holes H1. The second valley holes H2 may be arranged along a plurality of rows. The rows may be parallel to the first direction D1. The second valley holes H2 in an (n+1)th row may be arranged to be offset in the first direction D1 or an opposite direction of the first direction D1 from the second valley holes H2 in an n-th row as shown in FIG. 10A (n is a natural number of 1 or more) so that second valley holes H2 in the (n+1)th row may be located between the second valley holes H2 in the n-th row in a view in the second direction R2.

The first valley structure VS1 may be substantially the same as described above. The shapes of the first valley holes H1 and the second valley holes H2 may be variously modified.

FIG. 10B is a plan view for describing valley structures according to still another embodiment, and corresponds to an enlarged view of region II in FIG. 1B. FIG. 10B is a view in an unfolded state of the second area R2. Hereinafter, descriptions that overlap those provided above are omitted.

Referring to FIG. 10B, the first insulating layer 140 may include a third valley structure VS3 in addition to the first valley structure VS1 and the second valley structure VS2. The third valley structure VS3 may be provided between the first valley structure VS1 and the second valley structure VS2.

The first insulating layer 410 may have a third hole H3, and the third hole H3 may pass through the upper surface of the first insulating layer 410. The third valley structure VS3 may be defined by the third hole H3. One side wall and the other side wall of the third hole H3 may each extend in a direction parallel to the second direction D2. The other side wall of the third hole H3 may face the one side wall.

FIG. 10C is a plan view for describing valley structures according to yet another embodiment, and corresponds to an enlarged view of region II in FIG. 1B. FIG. 10C is a view in an unfolded state of the second area R2. Hereinafter, descriptions that overlap those provided above are omitted.

Referring to FIG. 10C, the first insulating layer 410 may include the first valley structure VS1, the second valley structure VS2, and the third valley structure VS3. The third valley structure VS3 may be provided between the first valley structure VS1 and the second valley structure VS2. The third valley structure VS3 may be defined by the third hole H3. One side wall of the third hole H3 may extend in a direction parallel to the second direction D2. The other side wall of the third hole H3 may face the one side wall of the third hole H3. The other side wall of the third hole H3 may have a concavo-convex shape. The concavo-convex portion of the other side wall of the third hole H3 may have a shape corresponding to shapes of adjacent first valley holes from among the first valley holes H1.

One or more embodiments may be in various combinations. In an embodiment, for example, at least two embodiments from among the embodiment of FIGS. 7A and 7B, the embodiment of FIGS. 8A and 8B, the embodiment of FIGS. 9A and 9B, the embodiment of FIG. 9C, the embodiment of FIG. 10A, the embodiment of FIG. 10B, and the embodiment of FIG. 10C may be combined with each other.

Although a display apparatus is mainly described above, one or more embodiments are not limited thereto. For example, a method of manufacturing a display apparatus for manufacturing such a display apparatus may be considered to belong to the scope of the disclosure.

According to one or more embodiments, in a plan view, an anti-reflection layer may be apart from at least one of an organic layer and a valley structure. Accordingly, the formation of a gap or cracks between an inorganic insulating layer and a substrate in an attachment process of an anti-reflection layer may be prevented. Even when the display apparatus is used for a long period of time, damage to a conductive line may be prevented. The display apparatus may exhibit improved durability and improved image characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate including a display area, a bending area, and a peripheral area between the display area and the bending area;

a display element layer provided on the display area of the substrate;

a thin-film encapsulation layer on the display element layer;

a first insulating layer on the thin-film encapsulation layer;

an anti-reflection layer on the first insulating layer; and an organic layer disposed on the peripheral area and the bending area of the substrate and apart from the display area of the substrate in a plan view in an unfolded state of the bending area, wherein the first insulating layer includes a valley structure provided on the peripheral area, the valley structure includes a valley hole, and in the plan view in the unfolded state, the anti-reflection layer is apart from at least one of the organic layer and the valley structure.

2. The display apparatus of claim 1, wherein in the plan view in the unfolded state, the anti-reflection layer is apart from the organic layer.

3. The display apparatus of claim 1, wherein in the plan view in the unfolded state, the anti-reflection layer is apart from the organic layer and the valley structure.

4. The display apparatus of claim 1, wherein in the plan view in the unfolded state, the anti-reflection layer is apart from the valley structure.

5. The display apparatus of claim 1, wherein the first insulating layer extends onto the organic layer, the organic layer extends onto the bending area of the substrate, and the valley hole passes through an upper surface of the first insulating layer.

6. The display apparatus of claim 1, further comprising:

a circuit layer on the display area of the substrate; and a planarization layer between the circuit layer and the display element layer, wherein the organic layer includes a first organic layer including a same material as the planarization layer, and apart from the planarization layer.

7. The display apparatus of claim 6, further comprising a pixel-defining layer on the planarization layer, wherein the organic layer further includes a second organic layer including a same material as the pixel-defining layer, and apart from the pixel-defining layer.

8. The display apparatus of claim 1, further comprising:

a buffer layer provided on the display area of the substrate;

a thin-film transistor disposed on the buffer layer; and an interlayer-insulating film in the thin-film transistor, wherein the buffer layer and the interlayer-insulating film extend onto the bending area of the substrate, and the organic layer is disposed on the interlayer-insulating film.

9. The display apparatus of claim 1, further comprising an input sensing layer between the display element layer and the first insulating layer, wherein the input sensing layer includes:

a first inorganic insulating layer;

a second inorganic insulating layer on the first inorganic insulating layer; and a conductive layer between the first inorganic insulating layer and the second inorganic insulating layer, and wherein the first inorganic insulating layer and the second inorganic insulating layer extend between the organic layer and the first insulating layer.

10. The display apparatus of claim 1, wherein the valley structure includes:

a first valley structure arranged adjacent to the display area of the substrate; and a second valley structure arranged between the first valley structure and the bending area of the substrate, wherein the first valley structure has a first valley hole passing through the first insulating layer, the second valley structure has a second valley hole passing through the first insulating layer, and the valley hole includes the first valley hole and the second valley hole.

11. The display apparatus of claim 10, wherein the valley structure further includes a third valley structure between the first valley structure and the second valley structure, and the third valley structure has a third valley hole passing through the first insulating layer.

12. The display apparatus of claim 1, wherein the first insulating layer has a bending groove provided on the bending area of the substrate, and the bending groove exposes an upper surface of the organic layer.

13. The display apparatus of claim 12, wherein the thin-film encapsulation layer includes a first inorganic encapsulation layer, an organic encapsulation layer, and a second inorganic encapsulation layer, which are stacked, and the first inorganic encapsulation layer and the second inorganic encapsulation layer are apart from the bending area of the substrate.

14. A display apparatus comprising:

a substrate including a display area and a peripheral area surrounding the display area;

a display layer provided on the display area of the substrate, wherein the display layer includes a circuit layer, a planarization layer, a pixel-defining layer, and a display element layer;

a first insulating layer on the display layer;

an anti-reflection layer on the first insulating layer; and an organic layer on the peripheral area, wherein the organic layer includes:

a first organic layer including a same material as the planarization layer, and apart from the planarization layer; and a second organic layer including a same material as the pixel-defining layer, and apart from the pixel-defining layer, wherein the first insulating layer includes a valley structure provided on the peripheral area of the substrate, and the valley structure includes a valley hole passing through an upper surface of the first insulating layer, and in a plan view in an unfolded state of the bending area, the anti-reflection layer is apart from at least one of the organic layer and the valley structure.

15. The display apparatus of claim 14, wherein the anti-reflection layer does not overlap the organic layer and the valley structure in the plan view in the unfolded state.

16. The display apparatus of claim 14, wherein a thickness of the organic layer is greater than a thickness of the first insulating layer.

17. The display apparatus of claim 14, further comprising an adhesive layer between the anti-reflection layer and the first insulating layer, wherein in the plan view in the unfolded state, the adhesive layer is apart from at least one of the organic layer and the valley structure.

18. The display apparatus of claim 14, wherein the planarization layer includes a first planarization layer and a second planarization layer on the first planarization layer, and the first organic layer includes:

a first lower organic layer including a same material as the first planarization layer, and apart from the first planarization layer; and a first upper organic layer including a same material as the second planarization layer, and apart from the second planarization layer.

19. The display apparatus of claim 14, wherein an end of the organic layer is provided between the anti-reflection layer and the substrate.

20. The display apparatus of claim 19, further comprising a second insulating layer on the first insulating layer, wherein the second insulating layer has a refractive index different from a refractive index of the first insulating layer, and the second insulating layer extends between the organic layer and the anti-reflection layer and overlaps the end of the organic layer in the plan view.

* * * * *